United States Patent [19]
Yamamoto et al.

[11] Patent Number: 6,027,792
[45] Date of Patent: Feb. 22, 2000

[54] COATING FILM EXCELLENT IN RESISTANCE TO HALOGEN-CONTAINING GAS CORROSION AND HALOGEN-CONTAINING PLASMA CORROSION, LAMINATED STRUCTURE COATED WITH THE SAME, AND METHOD FOR PRODUCING THE SAME

[75] Inventors: Seigo Yamamoto; Katsuhiro Itayama; Kouki Ikeda; Jun Hisamoto; Takashi Onishi, all of Kobe, Japan

[73] Assignee: Kabushiki Kaisha Kobe Seiko Sho, Kobe, Japan

[21] Appl. No.: 08/849,123

[22] PCT Filed: Oct. 3, 1996

[86] PCT No.: PCT/JP96/02887

§ 371 Date: Jun. 3, 1997

§ 102(e) Date: Jun. 3, 1997

[30] Foreign Application Priority Data

| Oct. 3, 1995 | [JP] | Japan | 7-256579 |
| Oct. 3, 1995 | [JP] | Japan | 7-256580 |
| Oct. 3, 1995 | [JP] | Japan | 7-256581 |
| Oct. 3, 1995 | [JP] | Japan | 7-256582 |
| Oct. 3, 1995 | [JP] | Japan | 7-256583 |
| Oct. 3, 1995 | [JP] | Japan | 7-256584 |
| Oct. 3, 1995 | [JP] | Japan | 7-256585 |
| Oct. 3, 1995 | [JP] | Japan | 7-256586 |

[51] Int. Cl.$^7$ ............................... C23C 14/08
[52] U.S. Cl. ............... 428/212; 204/192; 204/192.15; 204/192.26; 427/162; 428/216; 428/336; 428/428; 428/432; 428/697; 428/699; 428/701
[58] Field of Search ............... 428/697, 699, 428/701, 336, 216, 428, 432, 212; 204/192, 192.15, 192.26; 427/162

[56] References Cited

U.S. PATENT DOCUMENTS

| 4,769,291 | 9/1988 | Belkind et al. | 428/630 |
| 5,085,926 | 2/1992 | Iida et al. | 428/216 |
| 5,170,291 | 12/1992 | Szczyrbowski et al. | 359/580 |

FOREIGN PATENT DOCUMENTS

| 0536607A2 | 4/1993 | European Pat. Off. . |
| 53-146717 | 12/1978 | Japan . |
| 54-3118 | 1/1979 | Japan . |
| 61-13555 | 1/1986 | Japan . |
| 62-103379 | 5/1987 | Japan . |
| 63-161145 | 7/1988 | Japan . |
| 1-87760 | 3/1989 | Japan . |
| 1-312088 | 12/1989 | Japan . |

Primary Examiner—Archene Turner
Attorney, Agent, or Firm—Oblon, Spivak, McClelland, Maier & Neustadt, P.C.

[57] ABSTRACT

The present invention relates to a coating film excellent in resistance to corrosive halogen-containing gas and halogen-containing plasma, a method for producing the same, and technology utilizing the same.

More specifically, the coating film includes an aluminum oxide as an essential material and silicon-containing material, and the coating film has such a tightness that the content of the silicon-containing material is 5 wt % or less when reduced to silicon. In other word, the coating film has no peak of a half-value width of 5° or less in X-ray diffraction. In still other word, the coating film is a little short of oxygen having an oxygen-to aluminum atomic ration of 1.3 or more to below 1.5. The present invention provides a laminated structure coated with such a coating film such as a window material for use in a vacuum apparatus, and a method for producing the window material.

21 Claims, 5 Drawing Sheets

COATING FILM EXCELLENT IN RESISTANCE TO HALOGEN-CONTAINING GAS CORROSION AND HALOGEN-CONTAINING PLASMA CORROSION, LAMINATED STRUCTURE COATED WITH THE SAME, AND METHOD FOR PRODUCING THE SAME

FIELD OF THE INVENTION

The present invention relates to a coating film excellent in resistance to corrosive gas and plasma, a method for producing the same, and technology utilizing the same. More specifically, the present invention relates to a coating film excellent in resistance to halogen gases such as chlorine, bromine, fluorine and the like, and/or gases containing such halogen elements (hereinafter, referred to as a halogen-containing gas in some cases), halogen-containing plasma generated by these kinds of halogen gases and/or halogen-containing gases; a laminated structure coated with the coating film such as a window material for a vacuum apparatus; and a method for producing the same.

BACKGROUND ART

As the elements in semiconductor devices have been highly-integrated, the interconnections in the elements are required to be arranged with high precision of submicron unit. In such elements, if fine particles and/or bacteria attach to the interconnections, the interconnections will be short-circuited, which will immediately cause product failure. Therefore, gas and wash water used in the manufacturing of semiconductor devices are required to have extremely high purity. It is also required to protect inner walls of vacuum chamber, components for reaction room such as electrodes and a gas introduction pipe from generation of impurity gas and fine particles.

Under such conditions, it is recommended that a vacuum chamber is made of stainless steel and aluminum alloy, because stainless steel and aluminum alloy could release only small amount of gas and has excellent corrosion resistance in general. However, even if the vacuum chamber is made of the stainless steel and aluminum alloy, it is difficult to avoid the corrosion by the halogen-containing gas used as a reaction gas or an etching gas and halogen-containing plasma generated from the halogen-containing gas. In an attempt to solve this problem, it has been suggested to form a coating film including TiN, AlN, $Al_2O_3$ and the like as an essential material which exhibits excellent resistance to halogen-containing gas corrosion and halogen-containing plasma corrosion (see Japanese Utility Model Publication No. 61-13555, Japanese Laid-Open Patent Publication No. 1-312088, Japanese patent Publication No. 5-53871). As to the stainless steel, some technologies have been suggested to avoid its corrosion. For example, austenitic stainless steel is subjected to electrolytic polishing, and then is heated in oxidizing gas atmosphere. Accordingly, an amorphous oxide coating film is formed on the surface thereof, so that the surface releases only suppressed amount of gas (see Japanese Laid-Open Patent Publication No. 64-87760). In another technology, the content of non-metal inclusions is reduced to the value as small as possible, which may otherwise produce fine particles or may adsorb or release impurities (see Japanese Laid-Open Patent Publication No. 63-161145).

However, the properties of the coating film including TiN, AlN, $Al_2O_3$ and the like as an essential material depend on its production conditions, and the resistance to halogen-containing gas corrosion greatly depends on the properties of the coating film. It is difficult to provide a coating film which always exhibits stable and excellent resistance to a hydrogen chloride gas, a hydrogen fluoride gas, which has extremely high corrosiveness, and halogen-containing plasma. In addition, the above-described technology for stainless steel cannot achieve sufficient corrosion resistance in such highly corrosive environment. When corrosion starts, various problems arise. For example, corrosion products adsorb and release the gas, and in addition, the products themselves turn into fine particles and attach to the inner surface of the vacuum apparatus or the surface of the semiconductor wafer treated therein. As a result, the inside the chamber and the surface of the semiconductor wafer are contaminated.

Next, among the processes of manufacturing of semiconductor devices, it is known that a process of chemical vapor deposition in which a halogen-containing gas and halogen-containing plasma are used.

A chemical vapor deposition apparatus is categorized in some types in accordance with the methods for allowing the gas introduced into the vacuum chamber to decompose or react. Examples of chemical vapor deposition apparatus include a thermal chemical vapor deposition apparatus, a plasma chemical vapor deposition apparatus, an optical vapor deposition apparatus, and the combination thereof such as a thermal and plasma chemical vapor deposition apparatus. Hereinafter, a thermal and plasma chemical vapor deposition apparatus will be described as a typical example. As shown in FIG. 1, a lamp heater 3 is disposed below a chamber (a reaction chamber) 1, so that a susceptor 6 is heated through a window 2 made of transparent ceramics such as transparent quartz glass or material consisted with transparent glass composition. On the susceptor 6, a semiconductor wafer 7 is disposed so as to be heated to, for example, 450° C. by heat transferred from the susceptor 6. The air in the chamber 1 is discharged through an outlet 5, so that inside the chamber is kept under vacuum or under depressed pressure. Simultaneously, through an inlet 4, a material gas such as $WF_6$ gas or an etching gas is introduced into the chamber 1. In this state, a high frequency voltage is applied between the susceptor 6 and the chamber wall, so that plasma is generated from the material gas. In this process, a coating film with a desired composition such as a tungsten coating film is formed on the semiconductor wafer 7. In other words, the heat is transferred from the lamp heater 3 to inside the chamber 1 through the window 2, so that a material gas is decomposed, the reaction is started and promoted, the formation of a coating film on the semiconductor wafer 7 is promoted, the structure of the coating film is improved, and the adhesiveness of the coating film onto the semiconductor wafer 7 is enhanced.

In order to allow light (mainly an infrared ray) from the lamp heater 3 to efficiently penetrate through the window 2, the window 2 is required to be transparent. Therefore, the window 2 is made of material with high transparency. The window 2 is also required to be heat-resisting because its surface facing inside the chamber 1 is exposed to heat at high temperature. In addition, the window 2 is required to have resistance to halogen-containing gas and halogen-containing plasma for the aforementioned reasons.

Hereinafter, the halogen-containing gas corrosion and the halogen-containing plasma corrosion will be further described in detail by taking the chemical vapor deposition apparatus as an example.

Typical examples of halogen-containing gases include an $F_2$ gas and a $WF_6$ gas. After a coating film is formed, an etching gas containing $NF_3$ and the like may be introduced inside the chamber for cleaning purpose in some cases. Such a halogen-containing gas generates plasma during the formation or etching of the coating film, so that the surface of the window facing inside the chamber is exposed to the plasma. The window will be damaged or corroded if it is made of transparent ceramics, especially made of quartz glass solely made of $SiO_2$ having low resistance to halogen-containing gas corrosion and halogen-containing plasma corrosion.

If the inner surface of the window is damaged or corroded, the transparency of the window will be deteriorated even if the damage or corrosion is small. Such a window is not preferable to be used in the chamber. If the window is damaged or corroded more seriously, localized pit-like corrosion occurs, and cracks are generated therefrom, and in addition, the total thickness of the window becomes small. As a result, a vacuum apparatus with such a window cannot be continuously used for maintenance reasons. There are also some cases where $SiO_2$ is peeled-off from the window surface due to the corrosion. The removed $SiO_2$ floats inside the chamber forming fine particles and attach to the surface of the semiconductor wafer. This may cause a large number of failure on semiconductor devices.

Under such circumstances, it is necessary to prevent the window material from being corroded by halogen-containing plasma. For this purpose, the use of transparent material containing no $SiO_2$ can be considered. For example, plastic materials satisfy the requirement of transparency; however, there are problems in that their heat resistance is low and gas is released therefrom, and therefore, is not adequate for a window material for a chamber of a heat and plasma chemical vapor deposition apparatus. Instead of plastic materials, the use of ceramic material containing no $SiO_2$ is also considered, because their heat resistance is high and small amount of gas is released therefrom. In this case, the ceramics material is required to be singlecrystalline or amorphous, because the polycrystalline ceramic material has problems in its transparency. However, both of them will have problems in their productions. That is, it is very difficult to produce a window material made of singlecrystalline ceramic having large diameter and large thickness. Especially, in a chemical vapor deposition apparatus, recently, a wafer of 8 inches or more in diameter is mainly treated. Such a wafer requires the chemical vapor deposition apparatus to have a window of more than 8 inches in diameter. Therefore, it is not practical to develop the window material made of singlecrystalline ceramic. On the other hand, production of the amorphous ceramic also has a problem in its thermodynamic point of view, and it is extremely difficult to produce an amorphous window material large in diameter.

In general, in the chemical vapor deposition apparatus, a process of producing a coating film and cleaning is repeated. In accordance with the conditions of this process, heating and cooling are repeated within a range between the room temperature and 450° C. inside the chamber 1. At this time, the window material, which is a component of the chamber 1, is also subjected to the repeated heating and cooling.

In this case, even if a coating film including $Al_2O_3$ is formed on a quartz glass to achieve the resistance to halogen-containing gas corrosion and halogen-containing plasma corrosion, the $Al_2O_3$ coating film may be cracked or partially peeled off. This is because the quartz glass has thermal expansion coefficient of about $5 \times 10^{-7}$/°C. and $Al_2O_3$ has that of about $8 \times 10^{-6}$/°C. The difference is 10 times or more. This large difference produces large thermal stress during the heating and cooling, which is then induced onto the $Al_2O_3$ coating film. When the $Al_2O_3$ coating film becomes cracked, a halogen-containing gas penetrates to the surface of the substrate of the window material through the coating film. This may accelerate the peeling of the coating film further. At the portion where the coating film is peeled off, the quartz glass is exposed to halogen-containing plasma, so that $SiO_2$ is generated in a form of fine particles.

In order to prevent a coating film from being cracked due to the thermal stress, a method for forming a metal aluminum coating film and $Al_2O_3$ coating film on a quartz glass substrate has been suggested (see Japanese Utility Model Publication No. 61-13555). However, this method causes problem that the semiconductor wafer treated inside the chamber is not sufficiently heated because the metal aluminum coating film is opaque and cuts off the light from the lamp heater.

Methods for coating the substrate of the window material with zirconia, alumina, or mixed oxides thereof have been also suggested (see Japanese Laid-Open Patent Publications Nos. 53-146717 and 54-3118). However, in these inventions, the coating film is crystalline which is hard and brittle. Therefore, when the semiconductor wafer is heated or the temperature increases by plasma, cracks and pin holes are easily produced in the coating film. Through the cracks or pin holes, halogen-containing plasma may penetrate to etch the substrate of the window material.

The present invention has been conducted to solve the above-described problems, and the objective thereof is to provide a coating film which stably exhibits excellent resistance to halogen-containing gas corrosion and halogen-containing plasma corrosion; a laminated structure coated with the same, for example, a window material for a vacuum chamber; and a method for producing the same.

Another objective of the present invention is to provide a laminated structure, for example, a window material for a vacuum apparatus, provided with a coating film which will not become cracked or peeled off due to the thermal influence with high transparency.

DISCLOSURE OF THE INVENTION

The coating film of the present invention includes an aluminum oxide as an essential material and silicon-containing material as an impurity. The coating film preferably has such a tightness that the content of the silicon-containing material is 5 wt % or less, more preferably 1 wt % or less, and most preferably 0.5 wt % or less when reduced to silicon. The preferable size of the silicon-containing material is 0.5 μm or less, and more preferably 0.1 μm or less.

In another aspect, the coating film of the present invention has no peak of a half-value width of 5° or less in X-ray diffraction. Such a property indicates that the aluminum oxide is substantially amorphous.

Preferably, the coating film has an oxygen-to-aluminum atomic ratio of 1.3 or more to below 1.5 and has no peak of a half-value width of 5° or less in X-ray diffraction. This atomic ratio indicates that the coating film has the amount of oxygen smaller than the stoichiometric ratio of $Al_2O_3$ (oxygen-to-aluminum=3/2=1.5).

In still other aspect, the coating film has such a tightness as to include 5 atm % or less of argon as an impurity, or as to have a hundred projections and/or recesses or less in average over the surface having been etched for 1 minute at 80° C. using a phosphoric acid (at purity of 85%) at a view of 30×50 (μm) with use of a scanning electron microscope of 2000 magnifications.

The coating film has such a tightness that when etched, the area rate of the non-etched portion is preferably 10% or less, and more preferably 5% or less. This is because the $Al_2O_3$ coating film excellent in resistance to halogen-containing gas corrosion and halogen-containing plasma corrosion is amorphous. The amorphous coating film having high uniformity exhibits high corrosion resistance. It is also preferable that the thickness of the coating film is in the range between 0.1 and 20 μm.

According to the present invention, the laminated structure is obtained by forming the above-described coating film onto an arbitrary substrate.

According to the present invention, the window material for use in a vacuum apparatus is made of transparent ceramics. The surface thereof which faces inside the chamber is ion-implanted by one or more elements selected from the group consisting of aluminum, silicon, oxygen, and nitrogen to form a concentration enriched layer. On the concentration enriched layer, the coating film of the present invention is formed. The thickness of the coating film is preferably in the range between 0.1 and 20 μm.

According to the present invention, the window material for use in a vacuum apparatus has a base layer having a thermal expansion coefficient which is equal to or larger than the thermal expansion coefficient of the material for the window material and is smaller than the thermal expansion coefficient of the coating film of the present invention. On the base layer, the coating film of the present invention is formed.

The details of the base layer satisfying the requirements of the above-described thermal expansion coefficients are as follows.

(A) A base layer having the thermal expansion coefficient larger than that of window material and smaller than amorphous $Al_2O_3$ includes one or more materials selected from the group consisting of $ZrO_2$, $HfO_2$, $TiO_2$, borosilicate glass (in some cases, $ZrO_2$ is used as a general term for them) are used.

(B) A base layer having the thermal expansion coefficient equal to the window material includes $SiO_2$. This is because the window material is substantially made of a material including $SiO_2$.

(C) A base layer may be a crystalline base layer including crystalline $Al_2O_3$ as an essential material.

In the case of (A) or (B), both the coating film and the base layer are preferably formed by sputtering, and the thickness of the base layer is in the range between 0.1 and 50% with respect to the total thickness of the coating film and the base layer. In the case of (C), the base layer is preferably formed by sputtering. It is particularly preferable that the base layer is formed by conventional sputtering using no magnet for a target portion, and the coating film is formed by magnetron sputtering or vacuum deposition. The preferable thickness of the base layer is in the range between 0.01 and 5 μm.

In the case of (A), (B), or (C), the preferable total thickness of the base layer and the coating film is in the range between 0.1 and 20 μm.

According to the method for forming a coating film of the present invention, a coating film is formed on a substrate by high frequency magnetron sputtering using a target material made of $Al_2O_3$ in a discharge gas containing argon as a main component and 5 atm % or less of $O_2$.

According to the method for forming a coating film of the present invention, a coating film including aluminum oxide as a main component is formed on a substrate including $SiO_2$ as an essential material using an inert gas as a discharge gas. Sputtering is carried out in a state that the portion of the surface of the substrate not to be coated with the coating film is shielded from the electric field generated by inert gas plasma. When the surface of the substrate made of transparent ceramic, used as a window material, is coated with a coating film excellent in resistance to halogen-containing gas corrosion and halogen-containing plasma corrosion, sputtering is carried out in a state that the side surfaces and the outer surface of the substrate are shielded from the electric field generated by inert gas plasma. In this process, the surface of the substrate (facing inside the chamber) is coated with a coating film including an aluminum oxide as an essential material.

BEST MODE FOR CARRYING OUT THE INVENTION

As has been already described, it is known to use a film including an aluminum oxide for protecting a metallic material and the like (Japanese Utility Model Publication No. 61-13555). The corrosion resistance of the coating film depends on its properties, so that the present inventors have conducted various studies on the relationship between the properties and the corrosion resistance of the coating film. According to the studies, an aluminum oxide-containing coating film is required to have a tightness as high as possible. There are various definitions for defining the tightness.

First, it has been found that the content and the size of silicon-containing impurities (silicon or silicon compound) should be controlled.

If silicon-containing impurities are present in the aluminum oxide-containing coating film, the reactivity is activated at the silicon impurities-containing portion in a halogen-containing gas or halogen-containing plasma, so that various reaction products are produced. For example, tetrafluorosilicon is produced in the presence of fluorine gas. Such reaction products promote the plasma reaction (see FIG. 2(a)) so as to produce pits and local peeling in the aluminum oxide-containing coating film. As a result, the coating film loses protection effect and the substrate coated therewith becomes corroded.

However, when the content of silicon-containing impurities is suppressed to 5 wt % or less (preferably 1 wt % or less, and more preferably 0.1 wt % or less), and also the silicon-containing impurities disperse in a form of fine particles (size of 0.5 μm or less, and preferably 0.1 μm or less), the aluminum oxide-containing coating film has very high tightness. Accordingly, the sufficient corrosion resistance can be achieved. This is because the reactivity of the coating film with plasma is decreased when the content of the silicon-containing impurities is in the above value in a state of dispersing in a form of fine particles.

Figure 3:
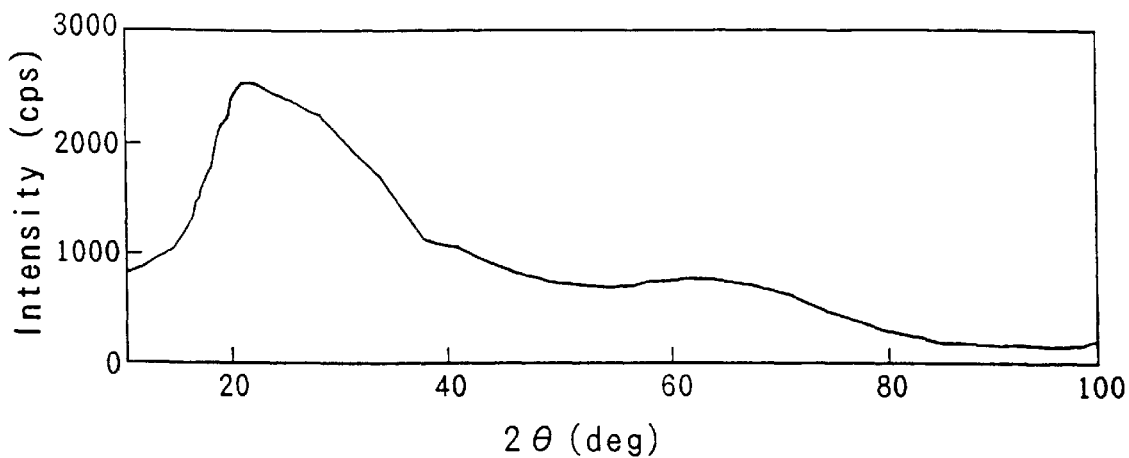
FIG. 3 is a graph illustrating an X-ray diffraction pattern of a coating film including an aluminum oxide as an essential material according to the present invention (a coating film having a thickness of 5 μm is formed on a glass substrate)
Figure 4:
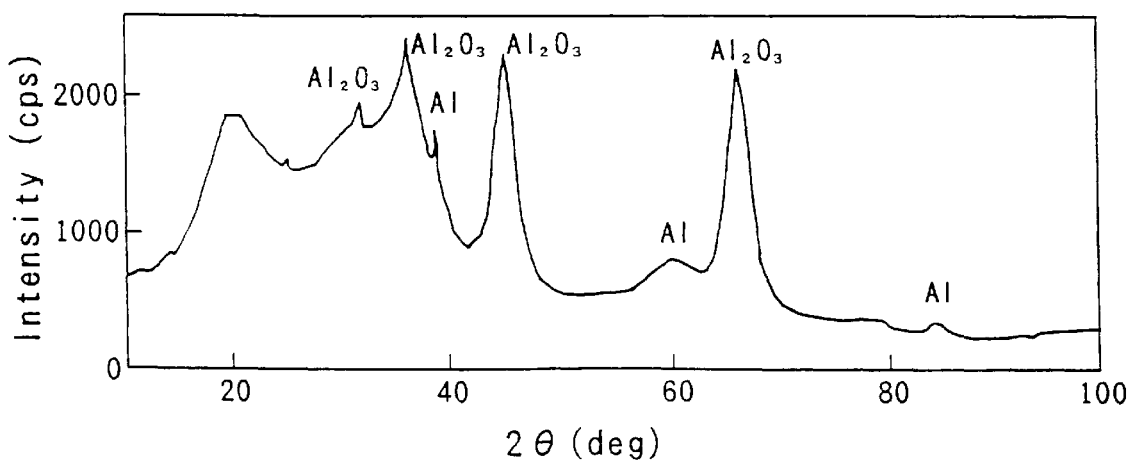
FIG. 4 is a graph illustrating an X-ray diffraction pattern of a coating film including an aluminum oxide as an essential material and crystalline portions.

Second, it has been found that the aluminum oxide-containing coating film is required to have no peak of half-value width of 5° or less in X-ray diffraction (see FIG. 3). In other words, the aluminum oxide-containing coating film is required to be amorphous. Contrary to this, if the coating film is crystalline, i.e., polycrystalline or has crystalline portions and amorphous portions in a mixed state, the grain boundary between crystalline portions or the interface between a crystalline portion and an amorphous portion are corroded by halogen-containing gas and halogen-containing plasma. As a result, cracks and pin holes are produced, which results in the corrosion of the substrate.

When the aluminum oxide-containing coating film is singlecrystalline, the corrosion such as described above can be avoided. However, it is technically difficult to produce a wholly singlecrystalline coating film. Even if the wholly singlecrystalline coating film can be produced, the residual stress generated during its formation is large, so that the coating film becomes easily cracked or peeled off. As a result, it is the most advantageous that the whole coating film is substantially amorphous.

Figure 5:
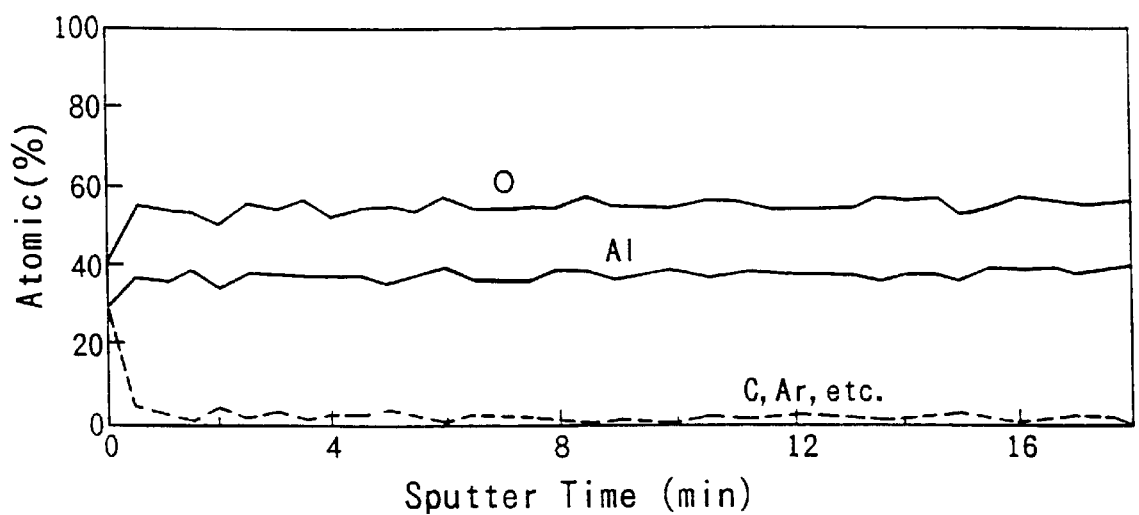
FIG. 5 is a graph illustrating the results of an analysis performed in a depth direction of a coating film including an aluminum oxide as an essential material to analyze its components using an X-ray photoelectron spectroscopy (a coating film having a thickness of 5 μm is formed on a glass substrate)

Furthermore, as a result of studies on the chemical composition of an aluminum oxide, it has been found that the amount of oxygen is required to be relatively short with respect to the stoichiometric ratio (see FIG. 5). If the aluminum oxide-containing coating film contains excessive oxygen, that is, if the ratio of oxygen to aluminum is 1.5 or more, the corrosion starts from the portions containing excessive oxygen by halogen-containing gas and halogen-containing plasma. As a result, the corrosion of the coating film will be accelerated. Therefore, the atomic ratio of oxygen to aluminum is required to be smaller than 1.5. On the other hand, if the amount of oxygen is too short, metal aluminum remaining unreacted with oxygen may be present. The corrosion concentrates to the metal aluminum remaining unreacted with oxygen. Accordingly, the ratio of oxygen to aluminum is required to be at least 1.3 or more, and more preferably 1.4 or more.

In addition, it has been found that the properties of aluminum oxide-containing coating film greatly depend on the amount of argon taken into the coating film from the atmosphere gas. Various kinds of physical vapor deposition can be used as the most advantageous methods for forming an aluminum oxide-containing coating film. During the formation of a coating method, argon present in the atmosphere gas is taken into the coating film, and the properties thereof greatly depend on the amount of argon taken therein. The amount of argon taken into the coating film depends on the concentration of argon in the plasma atmosphere and the experimental environment. With the content of argon of larger than 5 atm %, the coating film has decreased tightness, resulting in deterioration of resistance to halogen-containing gas and halogen-containing plasma. Accordingly, the upper limit of the content of argon is required to be 5 atm %, and more preferably 2 atm %. The lower limit of the content of argon is not limited to a specific value. It is difficult to keep the coating film free from argon, and in general, the coating film contains 0.001 atm % or more, and in some cases, 0.1 atm % or more of argon. No specific correlation has been recognized between such a small content of argon and corrosion resistance, and it cannot be concluded that the small content of argon is always harmful for the improvement of corrosion resistance.

As described above, the coating film can have high tightness by controlling the content of argon in the coating film. The tightness of the coating film can be examined by observing the surface of the coating film etched by a phosphoric acid. More specifically, the surface of the coating film is etched by a phosphoric acid having a purity of 85% at 80° C. for 1 minute, so that the projections and/or recesses are formed thereon. In the present invention, the coating film has sufficient tightness if the number of the projections and/or recesses are 100 or less in average, and more preferably 50 or less in average when observed at a view of 30×50 (μm) with use of a scanning electron microscope of 2000 magnifications. Hereinafter, this will be described in detail.

Figure 6:
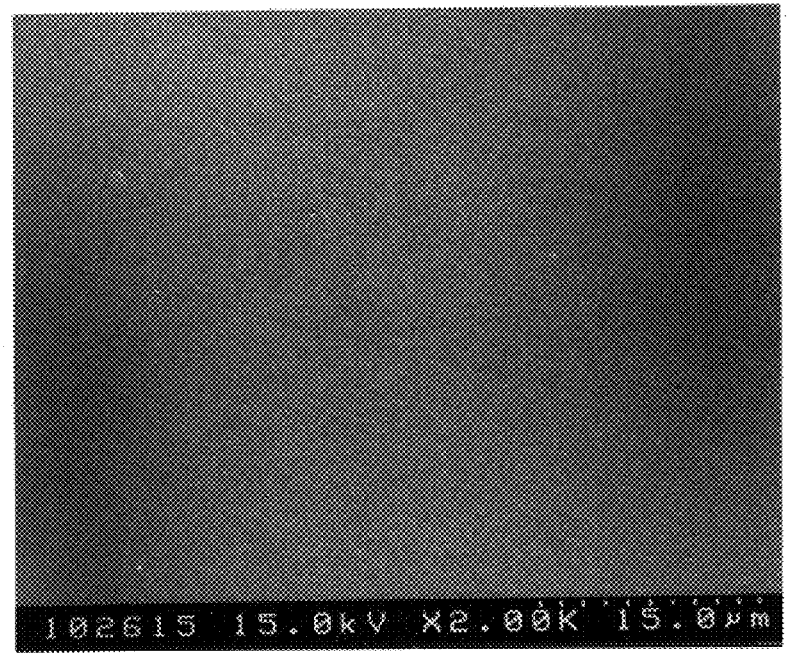
FIG. 6 is a photographic image showing an etched surface of a coating film including an aluminum oxide as an essential material according to the present invention using a scanning electron microscope (2000 magnifications)
Figure 7:
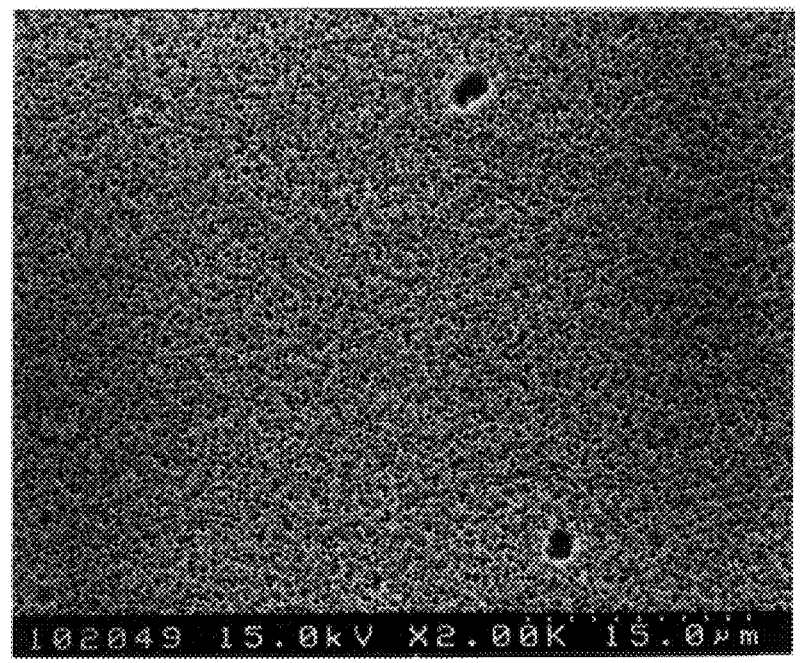
FIG. 7 is a photographic image showing an etched surface of a coating film including an aluminum oxide as an essential material with poor resistance to halogen-containing gas corrosion.

Various indicators can be employed to evaluate the tightness of aluminum oxide-containing coating film. As a result of various studies, it has been found that, after etching the surface of the coating film, the distance between the projections thereof adjacent to each other is the best indicator of the resistance to halogen-containing gas corrosion. FIG. 6 is a photographic image showing the etched surface of an aluminum oxide-containing coating film with very excellent resistance to halogen-containing gas corrosion. After etched by a phosphoric acid, the surface was observed by a scanning electron microscope (2000 magnifications). Due to the presence of the aluminum oxide-containing coating film with very excellent resistance to halogen-containing gas corrosion, substantially no projections and/or recesses are found. FIG. 7 is a photographic image showing the etched surface of an aluminum oxide-containing coating film with poor resistance to halogen-containing gas corrosion. After etched by a phosphoric acid, the surface was observed by a scanning electron microscope (2000 magnifications). In spite of the presence of the aluminum oxide-containing coating film, more than 100 of projections and/or recesses was observed at a view of 30×50 ($\mu$m) with use of a scanning electron microscope. In FIG. 7, two black points relatively large in size are impurities other than aluminum and oxygen. In the present invention, the substantially amorphous aluminum oxide-containing coating film exhibits excellent resistance to halogen-containing gas corrosion, and has uniform and tight surface after etched by a phosphoric acid. Accordingly, two black points in FIG. 7 are not counted as projections and/or recesses. Furthermore, if the coating film has impurities other than aluminum and oxygen or has crystalline portions, the etched surface may have some projections and/or recesses irregular in shapes and several times in size as compared with the etched surface of the wholly amorphous coating film. Such projections and/or recesses are not counted in the present invention. As will be described in Examples, the number of the projections and/or recesses of the amorphous aluminum oxide-containing coating film have close relationship with the resistance to halogen-containing gas corrosion and halogen-containing plasma corrosion.

If necessary, the portions which are not etched by a phosphoric acid are controlled to have small area (i.e., the portions having an undesirable property for an amorphous coating film. Hereinafter, these portions may be referred to as non-etched portions in some cases).

Figure 2:
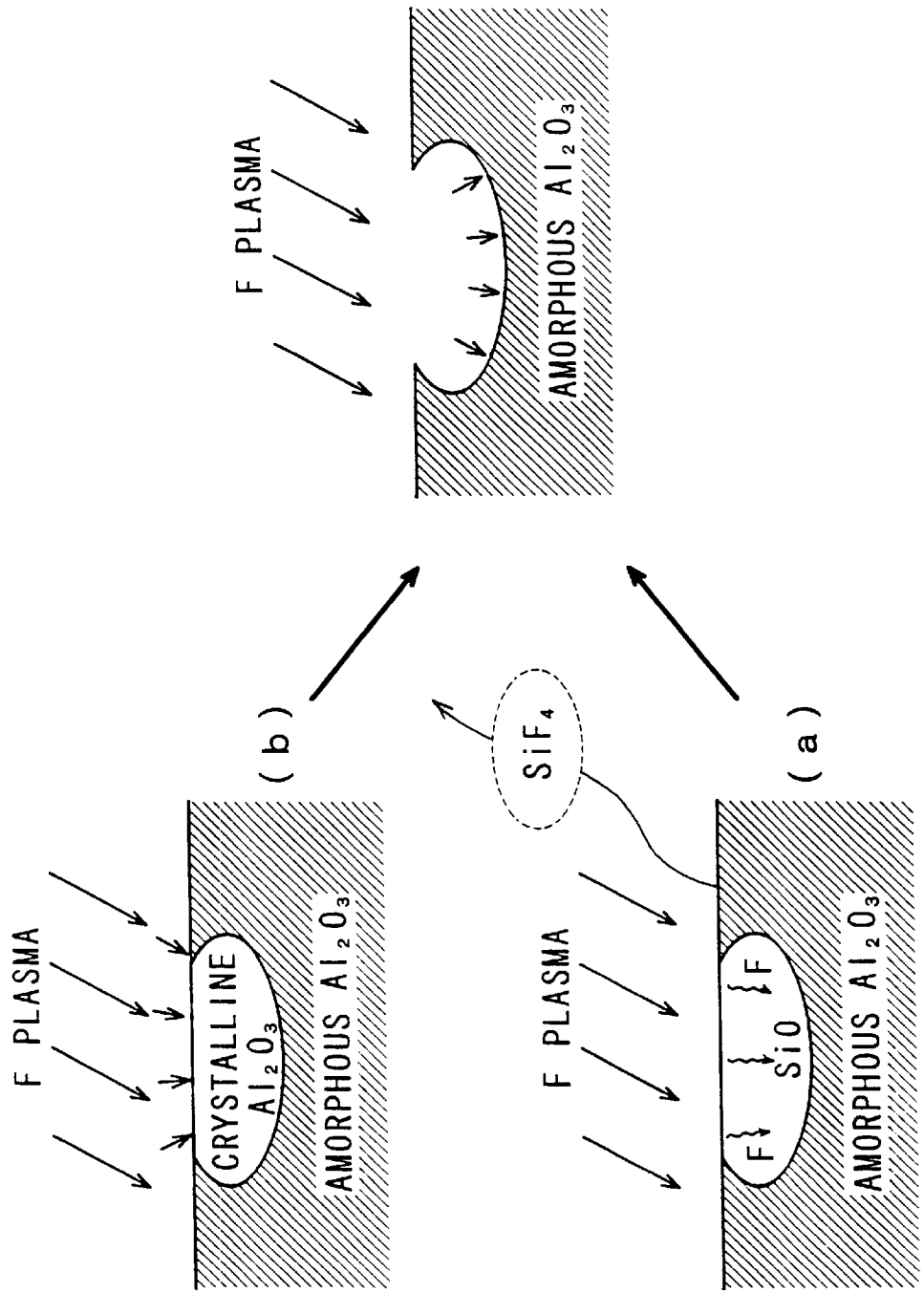
FIG. 2 is a diagram showing the proceeding of corrosion in the case where a coating film including an aluminum oxide as an essential material has some damage.

The tightness of the $Al_2O_3$ coating film can be defined by the uniformity of the amorphous coating film. More specifically, when the surface of the coating film is etched, the total surface area rate of the non-etched portions is 5% or less (i.e., the area rate of nonuniform portions observed at a view of 30×50 ($\mu$m) with use of a scanning electron microscope). In other words, when a coating film including a silicon-containing compound or crystalline portions is etched by a phosphoric acid capable of etching aluminum oxide, these portions remain non-etched. With a large area rate of non-etched portions, the coating film has poor tightness as a whole. To the non-etched portions, halogen-containing gas and halogen-containing plasma are concentrated, causing selective or localized corrosion such as shown in FIG. 2(b). Such a corrosion produces pits and peeling of the non-etched portions, and as a result, the $Al_2O_3$ coating film does not protect the substrate, and the corrosion of the substrate is accelerated. The present inventors have found that there is a high reproducibility between the non-etched portions and resistance to halogen-containing gas corrosion and halogen-containing plasma corrosion.

The thickness of the aluminum oxide-containing coating film is not limited to a specific value, and the preferable lower limit is 0.1 $\mu$m, and more preferably 0.5 $\mu$m. With the thickness of less than 0.1 $\mu$m, the coating film cannot completely coat the surface of the substrate, so that the substrate is partially corroded. The upper limit thereof is preferably 20 $\mu$m for assuring safety. Whereas the thickness larger than this value enhances the corrosion resistance, the larger absolute stress (including thermal stress and other stresses due to the shape and formation conditions of the coating film: actual stress) is loaded to the coating film. As a result, the coating film is likely to become cracked or peeled off.

A method for forming the aluminum oxide-containing coating film is not specifically limited, and in general, sputtering or vacuum deposition is employed. There methods enable the formation of amorphous aluminum oxide-containing coating film with high uniformity which exhibits excellent resistance to halogen-containing gas corrosion and halogen-containing plasma corrosion. The sputtering is not limited to a specific kind, and typically RF (high frequency) magnetron sputtering is employed. The preferable vacuum deposition is an ion assist vacuum deposition. Contrary to this, the ion plating and the chemical vapor deposition are not preferable in some cases, because these methods have problems in that the crystalline aluminum oxide-containing coating film is likely to be formed and the composition of the coating film may vary.

In the present invention, the substrate coated with the amorphous aluminum oxide-containing coating film is not limited to a specific kind. Typical examples thereof include metallic materials such as aluminum, magnesium, steel, ceramics such as oxides, carbides, nitrides, borides of silicon, aluminum, titanium and the like, and plastics. In addition, the substrate may be in various shapes such as a plate-like shape, a stick-like shape, a wire-like shape, a tube-like shape and the like depending on the intended use and the application thereof.

In the present invention, the application of the coating film is not specifically limited. When a substrate made of transparent ceramic is coated with the coating film, the resultant is a very preferable window material for use in a vacuum apparatus. As has been already described, a preferable window material is required to have high transparency and high heat resistance, in addition to be coated with the coating film having excellent properties. As a result of various studies, the present inventors have found that a window material satisfying such requirements can be obtained by controlling the relationship between the transparent ceramics (hereinafter, represented by a quartz glass) and an amorphous $Al_2O_3$ coating film. In this process, the strength against the heat stress is increased, thereby preventing the cracking and peeling.

As one method, the surface of the quartz glass is ion-implanted by one or more elements selected from the group consisting of aluminum, silicon, oxygen, and nitrogen to form a layer having enriched concentration. With such a concentration enriched layer, the quartz glass gains high resistance to heat shock without degrading its transparency. The reason thereof is as follows. As a result of ion implantation, a layer under a non-thermal equilibrium condition is formed on the surface of the quartz glass. This layer serves as a cushioning material against the thermal stress, thereby preventing the cracking and the peeling.

Examples of especially adequate ions to be implanted for forming the non-thermal equilibrium layer include aluminum, silicon, oxygen, and nitrogen under the condition that the ion is implanted to a quartz glass and the coating film is an amorphous $Al_2O_3$ coating film.

These ions are implanted alone or in the mixture thereof. The amount of ion implantation is not limited to a specific value, and the preferable lower limit thereof is $1\times10^{15}$ ion/cm$^2$ in total. The upper limit of $1\times10^{18}$ ion/cm$^2$ is sufficient, because even if the amount of the ion implantation exceeds this value, the effect is not enhanced any more. The ion-implanted quartz glass is kept transparent, because the quartz glass and the concentration enriched layer formed by ion implantation have an identical matrix structure with each other.

There is another method for increasing the strength against thermal stress. That is, a base layer is formed between the quartz glass and the amorphous $Al_2O_3$ coating film. It is advantageous to form a base layer (A), (B), or (C) on the surface of the quartz glass. Hereinafter, the base layer (A), (B), and (C) respectively will be described in detail.

As to the base layer (A), the thermal expansion coefficient of $ZrO_2$ and the like is as follows:

$ZrO_2$: $5\times10^{-6}/°C$.

$HfO_2$: $6\times10^{-6}/°C$.

$SnO^2$: $4\times10^{-6}/°C$.

TiO2: $7\times10^{-6}/°C$.

borosilicate glass: $3\times10^{-6}/°C$.

These values are larger than the aforementioned thermal expansion coefficient of the quartz glass ($5\times10^{-7}/°C$.) and smaller than the thermal expansion coefficient of the $Al_2O_3$ ($8\times10^{-6}/°C$.). Therefore, when the base layer includes such compound, the thermal stress caused by the difference between the thermal expansion coefficients such as described in Background Art can be reduced, thereby preventing the amorphous $Al_2O_3$ coating film from being cracked or peeled off. In addition, the base layer (A) can have high transparency by properly controlling the conditions of the formation thereof. The combination of the base layer (A) with the amorphous $Al_2O_3$ coating film having high transparency provides a window material sufficiently satisfies the requirements for use in a chemical vapor deposition apparatus.

The base layer (B) including $SiO_2$ prevents the amorphous $Al_2O_3$ coating film from being cracked or peeled off by mechanism other than that of the base layer (A). More specifically, with the $SiO_2$ base layer, the $Al_2O_3$ coating film adheres to the quartz glass more firmly as compared with the case of directly forming the $Al_2O_3$ coating film onto the quartz glass. As a result, the $Al_2O_3$ coating film is kept firmly adhered to the quartz glass in spite of the thermal stress. The reason thereof is as follows: 1) The quartz glass and the $SiO_2$ base layer includes the same compound as each other, so that they strongly adhere to each other; and 2) both the $SiO_2$ base layer and the amorphous $Al_2O_3$ coating film are thin films, so that the adhesion therebetween is remarkably stronger than the case of directly forming the amorphous $Al_2O_3$ coating film onto the quartz glass which is a bulk material.

The crystalline base layer (C) including $Al_2O_3$ has tightness higher than that of amorphous $Al_2O_3$ coating film, and exhibits excellent adhesion to the quartz glass which is a bulk material. The base layer (C) itself has high strength, and includes $Al_2O_3$ as well as the $Al_2O_3$ amorphous coating film. All of these factors are effective of preventing the cracking and the peeling against the thermal stress.

For the above reasons, all of the base layer (A), (B), and (C) are highly effective in preventing the amorphous $Al_2O_3$ coating film from being cracked or peeled off.

Hereinafter, a method for forming the base layer and the coating film will be described.

First, the case of the base layer (A) or the base layer (B) will be described. The $ZrO_2$ base layer or the $SiO_2$ base layer is formed, which is then covered with the amorphous $Al_2O_3$ coating film. A method for forming the base layer and the coating film is not specifically limited, and sputtering is especially preferable. In sputtering, each of particles has large energy and firmly adheres to the surface of the substrate. In addition, the amorphous $Al_2O_3$ coating film can be uniformly formed by properly controlling the conditions of the formation. In this manner, excellent resistance to halogen-containing gas corrosion and halogen-containing plasma corrosion can be achieved. The sputtering is not limited to a specific kind, and the RF (high frequency) magetron sputtering is desirable. Instead of sputtering, vacuum deposition can be employed. In contrast to sputtering or vacuum deposition, ion plating and chemical vapor deposition are not desirable. These methods are likely to produce a crystalline $Al_2O_3$ coating film, and in addition, to cause problem in that the composition of the obtained coating film may vary.

Next, the case of the base layer (C) will be described. Preferably, the crystalline $Al_2O_3$ base layer is formed by conventional sputtering, and the amorphous $Al_2O_3$ coating film is formed by RF magnetron sputtering. Hereinafter, this case will be described in more detail based on the results of experiments.

On a quartz glass, an $Al_2O_3$ film was formed by conventional sputtering (5 $\mu$m). On another quarts glass, an $Al_2O_3$ film was formed by RF magnetron sputtering (5 $\mu$m). Thus-obtained samples were respectively subjected to a thermal cycle test. The thermal cycle test was conducted by repeating the heating/cooling cycle 10 times. The detail of the test was as follows: 1) the samples were heated at the increased temperature from 50° C. to 550° C. at the rate of 50° C./min.; 2) next, the samples were held at 550° C. for 10 minutes; and 3) then, the samples were cooled at the rate of 15° C./min. During such a thermal cycle test, thermal stress was produced by the difference between the thermal expansion coefficient of the quartz glass and that of the alumina film. As a result of the test, the sample with the $Al_2O_3$ film formed by RF magnetron sputtering had stripe-shaped cracks, which revealed that the resistance to cracking was not sufficient. Contrary to this, the sample with the $Al_2O_3$ film formed by conventional sputtering had neither cracks nor peeling, which revealed that the resistance to heat and cracking was sufficient. This is because the $Al_2O_3$ film formed by RF magnetron sputtering is amorphous, and the $Al_2O_3$ film formed by conventional sputtering is crystalline.

The thickness of the $ZrO_2$ base layer (A) or the $SiO_2$ base layer (B) is preferably in the range between 0.1 and 50% of the total thickness of the base layer and the coating film. With the thickness of less than 0.1%, the base layer does not have sufficient performance including the cushioning effect against the thermal stress. With the thickness of more than 50%, the base layer itself has too large actual stress, so that the coating film easily becomes cracked or peeled off. In addition, the relative thickness of the amorphous $Al_2O_3$ coating film becomes small, resulting in the deterioration of resistance to halogen-containing gas corrosion and halogen-containing plasma corrosion. The more preferable thickness of the base layer(A) or (B) is in the range between 1% and 40%.

The thickness of the crystalline $Al_2O_3$ base layer (C) is preferably in the range between 0.001 $\mu$m and 5 $\mu$m. With the thickness of smaller than 0.001 $\mu$m, the base layer cannot sufficiently coat the quartz glass, which is the substrate, and does not sufficiently absorb the thermal stress. With the thickness of larger than 5 $\mu$m, the base layer itself has high actual stress, so that the coating film easily becomes cracked or peeled off. This is because the residual stress generated during the formation of the crystalline $Al_2O_3$ base layer is larger than that of the amorphous $Al_2O_3$ coating film. The preferable thickness is in the range between 0.1 $\mu$m and 3 $\mu$m.

The lower limit of the total thickness of the base layer and the coating film is preferably 0.1 $\mu$m or more, and more preferably 0.5 $\mu$m. With the thickness of less than 0.1 $\mu$m, the base layer and the coating film cannot completely coat the entire surface of the substrate. The substrate with insufficient coating may be partially corroded. On the other hand, the upper limit thereof is preferably 20 $\mu$m for assuring safety. Whereas the increased thickness enhances the corrosion resistance, the actual stress is increased, so that the coating film becomes easily cracked or peeled off.

In order to produce a preferable window material, it is important to control the method and the conditions for forming the $Al_2O_3$ coating film, which will be described below.

As has been already described, high frequency (RF) magnetron sputtering is the most advantageous for forming the amorphous $Al_2O_3$ coating film. If the amorphous $Al_2O_3$ coating film is formed by other methods such as RF conventional sputtering using no magnet and ion beam deposition used for general purpose, the actual stress may be increased or the crystalline $Al_2O_3$ may be produced in accordance with the thickness of the coating film and the conditions of the formation thereof. When a window material has such a coating film, the coating film may become cracked or peeled off due to the increase in the temperature by heating operation or plasma. As a result, the resistance to halogen-containing gas corrosion and halogen-containing plasma corrosion may be degraded. When the coating film is formed by reactive sputtering using metal aluminum as a target material, the discharge gas is required to contain a large amount of $O_2$ (i.e., 5% or more at partial pressure rate). As will be described later, this may cause the deterioration of the properties of the $Al_2O_3$ coating film.

Contrary to the above, the present inventors have found that the RF magnetron sputtering produces an $Al_2O_3$ coating film which produces only small coating stress and has high resistance to heat and cracking. As a method for further decreasing the amount of crystalline $Al_2O_3$ in the coating film, a substrate, is continuously cooled during the formation of the coating film. If the cooling process is omitted, the temperature of the substrate increases during the formation of the coating film, so that a part of $Al_2O_3$ in the coating film may be crystallized.

There is a further advantage of employing the RF magnetron sputtering. This method suppresses the amount of inclusions generated by impurities included in the coating film. Accordingly, the uniformity of the amorphous coating film is further increased as well as the enhanced resistance to halogen-containing gas corrosion and halogen-containing plasma corrosion.

If a discharge gas used in sputtering contains a large amount of $O_2$ gas at a partial pressure rate of 5% or more, a large number of minute pinholes may be formed in the $Al_2O_3$ coating film. If a substrate coated with a coating film having such pinholes is used as a window material for a vacuum apparatus, halogen-containing plasma penetrates through the pinholes and etches the substrate, so that the life of the window material is rapidly shortened. Accordingly, the discharge gas preferably contains $O_2$ gas at partial pressure rate of 5% or less, and more preferably 3% or less. For these reasons, the physical vapor deposition using $Al_2O_3$ as a target material is preferable instead of the reactive sputtering.

As has been already described, it is not preferable that the silicon-containing materials are present in the coating film. The present inventors have found that $SiO_2$ and metal silicon are mixed into the amorphous $Al_2O_3$ coating film because of self-bias of the quartz glass (including $SiO_2$) which is a substrate. In sputtering, plasma is produced from an argon gas and the like in a chamber. When $Ar^+$ is generated in plasma, the substrate in the vicinity of the $Ar^+$, which is an insulator, becomes negatively charged. As a result, the positive ions such as $Ar^+$ move to the negatively discharged portions where self-bias is formed. When move, the positive ions such as $Ar^+$ hit the surface of the substrate, so that the substrate is subjected to reverse sputtering. During the actual sputtering process for forming the amorphous $Al_2O_3$ coating film, such a self-bias is not formed on the surface of the substrate which will face inside the chamber. However, the side surfaces and the outer surface of the substrate are coated with almost no amorphous $Al_2O_3$ coating film, and are exposed to plasma generated from argon gas and the like. Under such a state, the self-bias is likely to be formed on the side surfaces and the outer surface. Therefore, the side surfaces and the outer surface of the substrate are sputtered and etched. From the etched portions of the substrate, metal silicon, $SiO_2$ and the like come out and penetrate into the amorphous $Al_2O_3$ coating film. As a result, the uniformity of the $Al_2O_3$ coating film degrades.

The present inventors have concluded that the above-described problems can be solved by shielding the side surfaces and the outer surface of the substrate from the electric field of the inert gas plasma. As a typical method for achieving this, the side surfaces and the outer surface of the substrate are covered with a metallic holder made of stainless steel, aluminum alloy and the like. In the embodiment of the present invention, a ring-shaped holder made of stainless steel is used as a typical example for this purpose. In addition, the below-methods also can be used for shielding the side surfaces and the outer surface of the substrate from the electric field:

1) a shield grid is provided in the vicinity of the surface of the substrate; and
2) a magnetic field is applied from the outside, so that plasma is concentrated to a specific region inside the chamber.

In the above description, a substrate made of a material including $SiO_2$ has been mainly described as a window material for use in a chemical vapor deposition apparatus. However, the present invention is not limited thereto, and can be widely applied to the case of sputtering a substrate made of a material including $SiO_2$ as an essential material.

EXAMPLES

Example 1

On the surface of various substrates, a coating film including an aluminum oxide was formed by vapor phase film formation. For comparison, a substrate on which no coating film is formed was also prepared. In this manner, samples were obtained. The samples coated with an aluminum oxide-containing coating film was subjected to a chemical analysis to analyze its composition, and also was etched at 80° C. for 1 minute using a phosphoric acid having a purity of 85% or more as an etchant. After being etched, the surface of each sample was observed to examine the size of silicon-containing materials and an area rate of the non-etched portions. In addition, in order to evaluate the resistance to halogen-containing gas corrosion, the samples were subjected to a gas corrosion test at 400° C. for 240 minutes in a mixed gas of 5% of chlorine and argon. When the test was finished, the appearance of each sample was observed to evaluate its corrosion resistance to gas. Moreover, an $NF_3$ plasma irradiation test was also conducted at 485° C. for 500 minutes at 300 W of high frequency output. When the test was finished, the appearance of each sample was observed to evaluate its corrosion resistance to plasma. The test results are shown in Table 1.

As is obvious from Table 1, the samples which satisfied the requirements of the present invention exhibited excellent corrosion resistance in both tests. Contrary to this, the samples which did not satisfy the requirements of the present invention exhibited only insufficient corrosion resistance. Especially, the samples No. 11 to 14 exhibited extremely poor corrosion resistance.

Example 2

The tests conducted in Example 1 were repeated. The test results are shown in Table 2.

Example 3

On the surface of various substrates, a coating film including an aluminum oxide was formed by vapor phase film formation. For comparison, a substrate on which no coating film was formed was also prepared. In this manner, samples were obtained. The samples coated with aluminum oxide-containing coating film was subjected to an X-ray diffraction to examine their respective crystalline structure. In addition, in order to evaluate the resistance to halogen-containing gas corrosion, the samples were subjected to a gas corrosion test at 400° C. for 240 minutes in a mixed gas of 5% of chlorine and argon. When the test was finished, the appearance of each sample was observed to evaluate its corrosion resistance to gas. Moreover, an $NF_3$ plasma irradiation test was also conducted at 485° C. for 500 minutes at 300 W of high frequency output. When the test was finished, the appearance of each sample was observed to evaluate its corrosion resistance to plasma. The test results are shown in Table 3.

As is obvious from Table 3, the samples which satisfied the requirements of the present invention exhibited excellent corrosion resistance in both tests. Contrary to this, the samples which did not satisfy the requirements of the present invention exhibited only insufficient corrosion resistance. Especially, the samples No. 42 and 43 exhibited extremely poor corrosion resistance.

Example 4

On the surface of various substrates, a coating film including an aluminum oxide was formed by vapor phase film formation. For comparison, a substrate on which no coating film is formed was also prepared. In this manner, samples were obtained. The samples coated with aluminum oxide-containing coating film was subjected to an X-ray photoelectron spectroscopy (XPS) to analyze their respective compositions and to an X-ray diffraction to examine their respective crystalline structure. In addition, in order to evaluate the resistance to halogen-containing gas corrosion, the samples were subjected to a gas corrosion test at 400° C. for 240 minutes in a mixed gas of 5% of chlorine and argon. When the test was finished, the appearance of each sample was observed to evaluate its corrosion resistance to gas. Moreover, an $NF_3$ plasma irradiation test was also conducted at 500° C. for 500 minutes at 350 W of high frequency output. When the test was finished, the appearance of each sample was observed to evaluate its corrosion resistance to plasma. The test results are shown in Table 4.

As is obvious from Table 4, the samples which satisfied the requirements of the present invention exhibited excellent corrosion resistance in both tests. Contrary to this, the samples Nos. 54 to 56 exhibited only insufficient corrosion resistance due to the presence of crystalline portions and the inadequate ratio of oxygen to aluminum. Especially, the samples Nos. 57 and 58 exhibited extremely poor corrosion resistance.

Example 5

On the surface of various substrates, a coating film including an aluminum oxide was formed by vapor phase film formation. For comparison, a substrate on which no coating film was formed was also prepared. In this manner, samples were obtained. The samples coated with an aluminum oxide-containing coating film was subjected to a chemical analysis to analyze its composition, and also was etched at 80° C. for 1 minute using a phosphoric acid having a purity of 85% or more as an etchant. After being etched, the surface of each sample was observed to examine the size of silicon-containing materials and an area rate of the non-etched portions. In order to evaluate the resistance to halogen-containing gas corrosion, the samples were subjected to a gas corrosion test at 400° C. for 240 minutes in a mixed gas of 5% of chlorine and argon. When the test was finished, the appearance of each sample was observed to evaluate its corrosion resistance to gas. Moreover, an $NF_3$ plasma irradiation test was also conducted at 485° C. for 500 minutes at 300 W of high frequency output. When the test was finished, the appearance of each sample was observed to evaluate its corrosion resistance to plasma. The test results are shown in Table 5.

As is obvious from Table 5, the samples which satisfied the requirements of the present invention exhibited excellent corrosion resistance in both tests.

Example 6

On the surface of various substrates, a coating film including an aluminum oxide was formed by vapor phase film formation as was conducted in Example 5. In this manner, samples were obtained. The samples were subjected to the same tests as those conducted in Example 5 to evaluate their respective properties and corrosion resistance. The test results are shown in Table 6.

As is obvious from Table 6, the samples which satisfied the requirements of the present invention exhibited excellent corrosion resistance.

Example 7

The surface of each quartz glass having a thickness of 2 mm was ion-implanted with any one of aluminum, silicon, oxygen, and nitrogen under various conditions, and an amorphous $Al_2O_3$ coating film having a thickness of 10 $\mu$m was formed thereon by RF magnetron sputtering using an $Al_2O_3$ target material having a purity of 99.99%. In this manner, samples were obtained. The samples were subjected to a thermal cycle test. In the test, the following heating and cooling cycle was repeated 500 times: 1) the samples were heated at the increased temperature from 50° C. to 600° C. at the rate of 50° C./min.; 2) next, the samples were held at 600° C. for 10 minutes; and 3) then, the samples were cooled at the rate of 15° C./min.; and 4) finally, the samples were held at room temperature for 10 minutes. When the test was finished, each sample was observed by a light-optic microscope to examine the peeling and cracking of the coating film, and the damage of the quartz glass. The test results are shown in Table 7.

The sample No. 82, which was not ion-implanted, corresponded with a prior art example in which an $Al_2O_3$ coating film was directly formed on the quartz glass. Without the ion-implanted layer as a cushioning material against the thermal stress, the sample No. 82 had many peeling and cracks in the coating film, and also had some damages in the quartz glass. The samples which were ion-implanted had no peeling in the coating film. There are only a few cracks in the coating film of the samples to which $1\times10^{15}$ ion/$cm^2$ or less of ion was implanted. From this result, it is recognized that the ion-implanted layer is effective in preventing the coating layer from becoming cracked.

Example 8

The surface of each quartz glass having a thickness of 2 mm was ion-implanted with aluminum under the condition of $1\times10^{17}$ ion/$cm^2$, and an amorphous $Al_2O_3$ coating film having a thickness varying in the range between 0.05 and 30 $\mu$m was formed thereon by the same method as that employed in Example 7. In this manner, samples were obtained. The samples were subjected to a thermal cycle test. In the test, the same heating and cooling cycle as that conducted in Example 7 was repeated 500 times at the temperature from the room temperature to 600° C. in plasma generated from an $NF_3$ gas. When the test was finished, the samples were observed by a light-optic microscope to examine the peeling and the cracks of the coating film, and the damage of the quartz glass. The test results are shown in Table 8.

The sample No. 99 had an amorphous $Al_2O_3$ coating layer with a thickness of 0.05 $\mu$m. This thickness was too small to sufficiently shield the quartz glass from halogen-containing plasma, so that the quartz glass had damage. The samples Nos. 100 to 105, having an amorphous $Al_2O_3$ coating layer with a thickness in the range between 0.1 and 20 $\mu$m, had no cracks in the coating layer and had no damage in the quartz glass, and there were only a few cracks in the coating film of samples Nos. 100 and 105. The samples Nos. 106 to 108, having amorphous $Al_2O_3$ coating layer with a thickness of larger than 20 $\mu$m, had increased peeling and cracks in the coating film. The portion of the quartz glass below the peeling and cracking was damaged.

Example 9

On the surface of each quartz glass having a thickness of 2 mm, a base layer including $ZrO_2$ and a coating film including $Al_2O_3$ was formed by RF magnetron sputtering using an $Al_2O_3$ target material having a purity of 99.99% and a $ZrO_2$ target material having a purity of 99.9%. The total thickness of the base layer and the coating film was 10 $\mu$m. In this manner, samples were obtained. The $ZrO_2$ base layer of each sample had a thickness varying in the range from 0 to 70% with respect to the total thickness of the base layer and the coating layer. The samples were subjected to a thermal cycle test. In the thermal cycle test, the following heating and cooling cycle was repeated 500 times: 1) the samples were heated at a temperature increased from the room temperature to 600° C. at the temperature rising rate of 50° C./min. in plasma generated from an $NF_3$ gas; 2) next, the samples were held at 600° C. for 10 minutes; 3) then, the samples were cooled at cooling rate of 15° C./min.; and 4) finally, the samples were held at room temperature for 10 minutes. When the test was finished, each sample was observed by a light-optic microscope to examine the peeling and cracking of the coating film, and the damage of the quartz glass. The test results are shown in table 9.

The sample No. 109, having no $ZrO_2$ base layer, corresponded with a prior art example in which an $Al_2O_3$ coating film was directly formed on the quartz glass. Without the base layer as a cushioning material against the thermal stress, the sample No. 109 had many peeling and cracks in the coating film, and also had some damages in the quartz glass. The sample No. 110 had a $ZrO_2$ base layer with a thickness of 0.05% with respect to the total thickness of the base layer and the coating film. Although the sample No. 110 had less peeling of the coating film than the sample No. 109, the $ZrO_2$ base layer was too thin to sufficiently serve as a cushioning material against the thermal stress. As a result, there were many cracks in the coating film. The samples Nos. 111 to 115 respectively had a $ZrO_2$ base layer with a thickness ranging from 0.1 to 50% with respect to the total thickness of base layer and the coating film. Each $ZrO_2$ base layer sufficiently served as a cushioning material against the thermal stress. As a result, there were only a few cracks in the coating film of the samples Nos. 111 and 115, and no peeling was found in the coating film in the samples Nos. 111 to 115. The samples Nos. 116 to 118 respectively had a $ZrO_2$ base layer with a thickness larger than 50%, and had increased peeling and cracks in the coating film.

Example 10

Repeating the processes of Example 9, samples were obtained. The total thickness of the base layer and the coating film was varied in the range between 0.05 and 30 $\mu$m, and the thickness of the $ZrO_2$ base layer was 10% with respect to this total thickness. The samples were subjected to a thermal cycle test in which heating and cooling cycle was repeated 500 times from room temperature to 600° C. in plasma generated from an $NF_3$ gas, as was conducted in Example 9. When the test was finished, the samples were observed by a light-optic microscope to examine the peeling and cracks of the coating film and the damage of the quartz glass. The test results are shown in Table 10.

The sample No. 119 had 0.05 $\mu$m of the total thickness of the coating film and the base layer. The thickness of the $Al_2O_3$ coating film was too small to sufficiently shield the quartz glass from halogen-containing plasma, so that the quartz glass was damaged. The samples Nos. 120 to 125, having the total thickness in the range between 0.1 and 20 $\mu$m, had no cracks in the coating layer and had no damage in the quartz glass, and there were only a few cracks in the coating film of samples Nos. 120 and 125. The samples Nos. 126 to 128, having the total thickness of larger than 20 $\mu$m, had increased peeling and cracks in the coating film. The portion of the quartz glass below the peeling and cracking was damaged.

Example 11

On the surface of each quartz glass having a thickness of 2 mm, a base layer including $SiO_2$ and a coating film including $Al_2O_3$ was formed by RF magnetron sputtering using an $Al_2O_3$ target material having a purity of 99.99% and an $SiO_2$ target material having a purity of 99.9%. The total thickness of the base layer and the coating film was 5 $\mu$m. In this manner, samples were obtained. The $SiO_2$ base layer of each sample had a thickness varying in the range from 0 to 70% with respect to the total thickness of the base layer and the coating layer. The samples were subjected to a thermal cycle test in which heating and cooling cycle was repeated 500 times from room temperature to 600° C. When the test was finished, the samples were observed by a light-optic microscope to examine the peeling and cracking of the coating film, and the damage of the quartz glass. The test results are shown in Table 11.

The sample No. 129, having no $SiO_2$ base layer, corresponded with a prior art example in which an $Al_2O_3$ coating film was directly formed on the quartz glass. Without the base layer as a cushioning material against thermal stress, the sample No. 129 had many peeling and cracks in the coating film. The sample No. 130 had an $SiO_2$ base layer with a thickness of 0.05% with respect to the total thickness of the base layer and the coating film. Although the sample No. 130 had less peeling of the coating film than the sample No. 129, the $SiO_2$ base layer was too thin to sufficiently serve as a cushioning material against the thermal stress. As a result, there were many cracks in the coating film. The samples Nos. 131 to 135 respectively had an $SiO_2$ base layer with a thickness ranging from 0.1 to 50% with respect to the total thickness of the base layer and the coating film, and each $SiO_2$ base layer sufficiently served as a cushioning material against the thermal stress. As a result, there were only a few cracks in the coating film of the samples Nos. 131 and 135, and no peeling was found in the coating film of the samples Nos. 131 to 135. The samples Nos. 136 to 138 respectively had an $SiO_2$ base layer with a thickness larger than 50% with respect to the total thickness of the base layer and the coating film, and had increased peeling and cracks in the coating film.

Example 12

Repeating the processes of Example 11, samples were obtained. The total thickness of the base layer and the coating film was varied in the range between 0.05 and 30 $\mu$m, and the thickness of the $SiO_2$ base layer was 10% with respect to this total thickness. The samples were subjected to a thermal cycle test in which heating and cooling cycle was repeated 500 times from room temperature to 600° C. in plasma generated from an $NF_3$ gas. When the test was finished, the samples were observed by a light-optic microscope to examine the peeling and cracks of the coating film and the damage of the quartz glass. The test results are shown in Table 12.

The sample No. 139 had 0.05 $\mu$m of the total thickness of the coating film and the base layer. The thickness of the $Al_2O_3$ coating film was too small to sufficiently shield the quartz glass from halogen-containing plasma, so that the coating film had peeling and cracks and the quartz glass was damaged. The samples Nos. 140 to 145, having the total thickness in the range between 0.1 and 20 $\mu$m, had no cracks in the coating layer and had no damage in the quartz glass, and there were only a few cracks in the coating film of samples Nos. 140 and 145. The samples Nos. 146 to 148, having the total thickness of larger than 20 $\mu$m, had increased peeling and cracks in the coating film. The portion of the quartz glass below the peeling and cracking was damaged.

Example 13

On the surface of each substrate made of fused quartz glass having a thickness of 20 mm, an alumina coating film was formed to have a thickness of 10 μm by the following method:

an RF magnetron sputtering (for sample No. 149);

an RF conventional sputtering (for sample No. 150)

a combination of an RF conventional sputtering and an RF magnetron sputtering (for sample No. 151); and a combination of an RF conventional sputtering and an ion assist deposition (for sample No. 152).

The samples Nos. 151 and 152, corresponding to the present invention, had a base layer which was a crystalline alumina coating film having a thickness of 1 μm.

Figure 1:
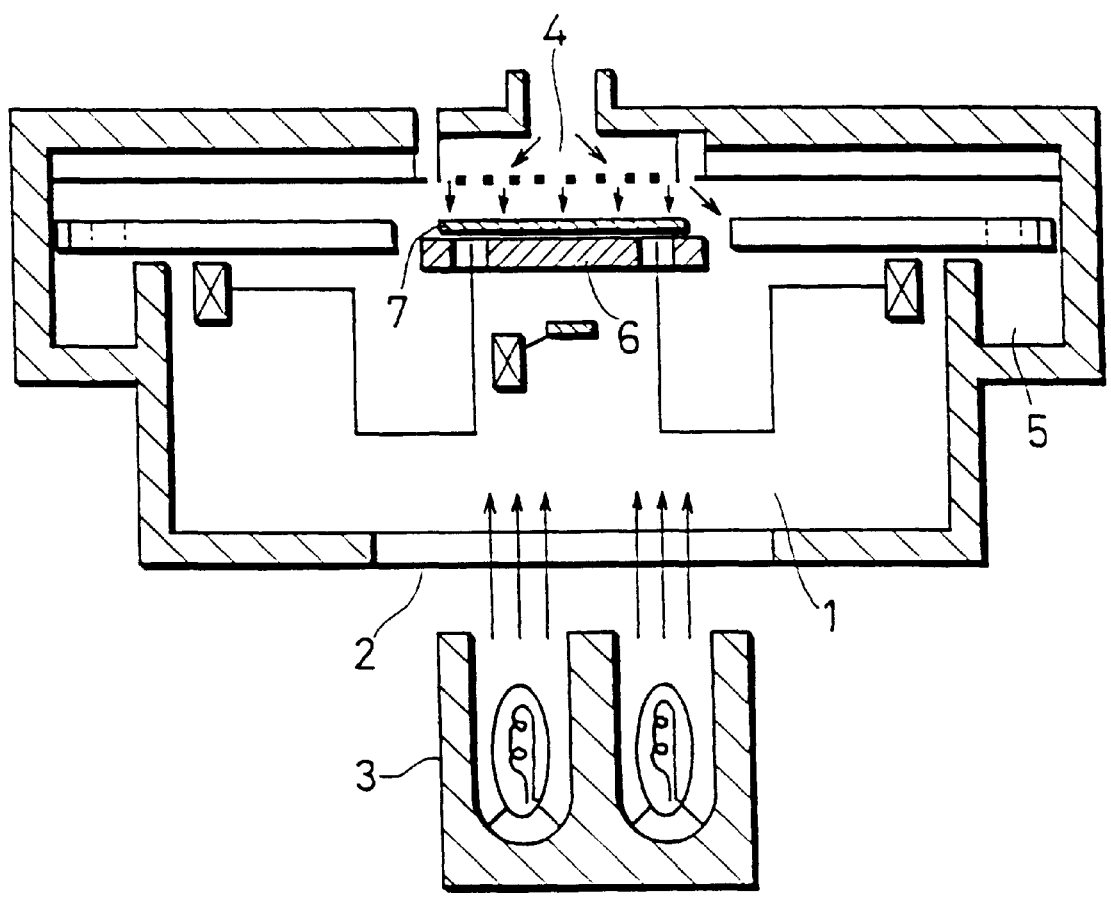
FIG. 1 is a diagram showing a thermal and plasma chemical vapor deposition apparatus.

Thus-obtained samples were mounted to the thermal and plasma chemical vapor deposition apparatus shown in FIG. 1 as a window material 2. In this state, the samples Nos. 149 to 152 were subjected to a plasma irradiation test. In the test, inside the chamber was heated to 485° C. while $NF_3$ plasma was discharged at 300 W of high frequency output for 500 minutes. When the test was finished, the appearance of each sample was observed to evaluate its resistance to halogen-containing gas corrosion and halogen-containing plasma corrosion. The test results are shown in Tables 13 and 14.

As is obvious from Table 13, an RF conventional sputtering was effective in achieving cracking resistance. As is obvious from Table 14, the samples Nos. 151 and 152, satisfying all the requirements of the present invention, exhibited excellent resistance to halogen-containing gas corrosion and halogen-containing plasma corrosion.

Example 14

On the (100) surface of silicon wafers having a diameter of 2 inches, an $Al_2O_3$ coating film having a thickness of 0.5 μm was formed by the following methods respectively:

1) a high frequency magnetron sputtering;

2) a high frequency conventional sputtering; and 3) an ion beam deposition.

In this manner, samples Nos. 153 to 155 were obtained. The samples 153 to 155 were scanned by a laser beam, so that the amount of warp of the substrate was measured based on the degree of its variation of the beam. In addition, the stress generated in the coating film was calculated based on the change in the amount of warp. Each of the $Al_2O_3$ coating film formed by one of the aforementioned methods was subjected to a stress measurement. The measurement results are shown in Table 15.

The $Al_2O_3$ coating film formed by high frequency magnetron sputtering (sample No. 153) had stress as small as 100 Mpa at the compressed side thereof. On the other hand, the $Al_2O_3$ coating films formed by other two methods (i.e., high frequency conventional sputtering and ion beam deposition: samples Nos. 154 and 155) had extremely high stress at the compressed side thereof.

Example 15

On the surface of each substrate made of fused quartz glass (used as a window material), an $Al_2O_3$ coating film having a thickness of 5 μm was formed using any one of three methods of Example 14. In this manner, samples Nos. 156 to 158 were obtained. Each of the samples Nos. 156 to 158 was mounted to the thermal and plasma chemical vapor deposition apparatus shown in FIG. 1 as a window material 2. In this state, the samples Nos. 156 to 158 were subjected to plasma irradiation test. In the test, inside the chamber was heated to 485° C. while $NF_3$ plasma was discharged at 300 W of high frequency output for 500 minutes. When the test was finished, the appearance of each sample was observed to evaluate its resistance to halogen-containing gas corrosion and halogen-containing plasma corrosion.

On the other hand, the samples 156 to 158 were subjected to a thermal cycle test. In the thermal cycle test, the following heating and cooling was repeated 10 times: first, the samples were heated at a temperature increased from 50° C. to 550° C. at a temperature rising rate of 50° C./min.; next, the samples were held at 550° C. for 10 minutes; then, the samples were cooled at a cooling rate of 15° C./min.; and finally, the samples were held at 50° C. for 10 minutes. When the test was finished, the appearance of each samples was observed to evaluate its heat resistance (based on the cracks in the $Al_2O_3$ coating film). The test results are shown in Table 16.

Example 16

On the surface of each substrate made of fused quartz glass (used as a window material), an $Al_2O_3$ coating film having a thickness of 5 μm was formed by high frequency magnetron sputtering using a sintered target material made of α—$Al_2O_3$ having a purity of 99.99% or more. In this manner, samples were obtained. In the formation of the $Al_2O_3$ coating film by the sputtering, a mixed gas of argon and oxygen was used as a discharge gas while changing the mixing ratio thereof. In this manner, samples Nos. 159 to 166 were obtained.

The samples Nos. 159 to 166 were etched at 80° C. for 1 minute using a phosphoric acid having a purity of 85% or more as etchant. Then, the etched surface of the $Al_2O_3$ coating film of each sample was observed by a scanning electron microscope to obtain the rate of area having pin holes with respect to the entire surface of the coating film.

Repeating the processes of Example 15, the resistance to halogen-containing gas corrosion and the halogen-containing plasma corrosion of samples 159 to 166 were evaluated. The test results are shown in table 17.

As is obvious from Table 17, the samples 159 to 161, satisfying the requirements of the present invention, had a rate of area with pin holes as small as 5%, and exhibited excellent resistance to halogen-containing gas and halogen-containing plasma.

Example 17

On the surface of a substrate made of fused quartz glass having a size of 232(φ)×12.7(t)mm, an $Al_2O_3$ coating film having a thickness of 5 μm was formed by RF magnetron sputtering using a sintered target made of α—$Al_2O_3$ having a purity of 99.99% or more. The sputtering was conducted in a batch-type and sputter-down-type high frequency magnetron sputtering apparatus using a pure argon gas as a discharge gas. The substrate was disposed on a turntable made of stainless steel (a substrate holder) situated on the bottom of inside the chamber of sputtering apparatus. In addition, a ring-shaped holder made of stainless steel was prepared. The ring-shaped holder was shaped to fit with the outer shape of the substrate, so that the side surfaces and the chamfer between the side surfaces and the inner surface of the substrate were completely covered so as to be shielded from the electric field generated by argon plasma. Upon fitted with the holder, the substrate was subjected to sputtering.

The substrate provided with the $Al_2O_3$ coating film was etched at 80° C. for 1 minute using a phosphoric acid having a purity of 85% or more as an etchant. The etched surface of the $Al_2O_3$ coating film was observed by a scanning electron microscope to see whether or not inclusions were present, and the rate of inclusions in an arbitrary portion with respect to the entire surface area of the coating film was obtained.

Example 18

Repeating the processes of Example 17, on the surface of a substrate having the same constituent as those used in Example 17, an $Al_2O_3$ coating film having a thickness of 5 μm was formed. The substrate was disposed on a turntable (a substrate holder) made of stainless steel situated on the bottom of inside the chamber of the sputtering apparatus. The ring-shaped holder used in Example 17 was not used for the substrate. The surface of the substrate provided with the $Al_2O_3$ coating film was observed to see whether or not inclusions were present.

The results of observation to see the presence of inclusions in the $Al_2O_3$ coating film in Examples 17 and 18 are shown in Table 18.

Table 18 shows the rate of the area containing inclusions with respect to the total surface area of the $Al_2O_3$ coating film. From the inclusions, silicon was detected by using an energy dispersive X-ray detector attached with a scanning electron microscope. As is obvious from Table 18, with the ring-shaped holder (i.e., when the side surfaces and the outer surface of the substrate were shielded from the electric field generated by the argon plasma), almost no inclusions containing silicon or silicon compound such as $SiO_2$ were present in the sputtered $Al_2O_3$ coating film. Contrary to this, without the ring-shaped holder (i.e., when the side surfaces and the outer surface of the substrate were not shielded from the electric field generated by argon plasma), inclusions having a diameter in the range between 0.3 and 0.5 μm were present on the entire surface of the sputtered $Al_2O_3$ coating film.

Consequently, if the side surfaces and the outer surface of the substrate are shielded from the electric field generated by argon plasma, the $Al_2O_3$ coating film contains no inclusions.

INDUSTRIAL APPLICABILITY

According to the present invention, a coating film having excellent resistance to halogen-containing gas corrosion and halogen-containing plasma corrosion, and a laminated structure covered therewith can be provided. In addition, it is also possible to provide a base layer and a coating film formed on the base layer. The combination of the base layer and the coating film of the present invention exhibits excellent resistance to halogen-containing gas and halogen-containing plasma without degrading the transparency and the heat resistance which are properties required for the window material for use in a vacuum apparatus. The window material of produced according to the present invention is durable against the thermal stress generated during the repeated heating and cooling and has no cracks and peeling during the use over the long time. In addition, when a metallic oxide-containing coating film is formed on the surface of the $SiO_2$ type substrate by sputtering, the side surfaces and the outer surface of the substrate are protected from reverse sputtering. As a result, there is no problem that silicon-containing materials penetrate into the coating film and deteriorates the uniformity of the coating film.

TABLE 1

| Sample No. | Kind of substrate | Film formation method | Si-containing matter * Content (WT %) | Si-containing matter ** Size (μm) | Thickness of coating film (μm) | Corrosion resistance Gas corrosion test | Corrosion resistance Plasma irradiation test |
|---|---|---|---|---|---|---|---|
| 1 | aluminum alloy | | 2 | 0.1 | 5 | ⊚ | ○ |
| 2 | | | 0.1 | 0.05 | 10 | ⊚ | ⊚ |
| 3 | | | 1 | 1 | 7 | ⊚ | ⊚ |
| 4 | | | 3 | 0.1 | 20 | ⊚ | ○ |
| 5 | titanium alloy | sputtering | 0.1 | 0.3 | 15 | ⊚ | ○ |
| 6 | stainless steel | | 3 | 0.5 | 0.2 | ⊚ | ○ |
| 7 | SiC | | 0 | — | 20 | ⊚ | ⊚ |
| 8 | | ion plating | 0.01 | 0.01 | 3 | ⊚ | ⊚ |
| 9 | stainless steel | sputtering | 4 | 1.0 | 10 | ○ | Δ |
| 10 | aluminum alloy | | 7 | 0.4 | 10 | ○ | Δ |
| 11 | | ion plating plasma CVD | 10 | 1.0 | 10 | Δ | x |

TABLE 1-continued

|  |  |  | Si-containing matter | | | Corrosion resistance | |
|---|---|---|---|---|---|---|---|
| Sample No. | Kind of substrate | Film formation method | * Content (WT %) | ** Size (μm) | Thickness of coating film (μm) | Gas corrosion test | Plasma irradiation test |
| 12 | SiC |  | 10 | 2 | 30 | Δ | x |
| 13 | aluminum alloy | — | 5 | 1.0 | — | x | x |
| 14 | SiC | — | — | — | — | ⊚ | x |

Result of evaluation
⊚: No corrosion
o Rate of area with corrosion is less than 1%.
Δ: Rate of area with corrosion is less than 5%.
x: Rate of area with corrosion is 5% or more.
*: Conent of silicon in an aluminum oxide.
**: Size of dispersing silicon-containing matter.

TABLE 2

|  |  |  | Si-containing matter | | | Corrosion resistance | |
|---|---|---|---|---|---|---|---|
| Sample No. | Kind of substrate | Film formation method | a* Content (WT %) | b** area rate (μm) | Thickness of coating film (μm) | Gas corrosion test | Plasma irradiation test |
| 15 | stainless |  | 0.5 | 3 | 15 | ⊚ | ⊚ |
| 16 | steel |  | 0 | 0 | 0.5 | ⊚ | ⊚ |
| 17 | aluminum |  | 1 | 1 | 7 | ⊚ | ⊚ |
| 18 | alloy | sputtering | 3 | 4 | 20 | ⊚ | o |
| 19 | titanium alloy |  | 0.1 | 0 | 15 | ⊚ | ⊚ |
| 20 | low alloy steel |  | 3 | 2 | 0.2 | ⊚ | o |
| 21 | SiC |  | 0.05 | 1 | 20 | ⊚ | ⊚ |
| 22 |  | ion plating | 0 | 0.1 | 3 | ⊚ | ⊚ |
| 23 | stainless steel |  | 4 | 12 | 10 | o | Δ |
| 24 | aluminum alloy | sputtering | 7 | 7 | 10 | o | Δ |
| 25 | titanium alloy | ion plating | 10 | 20 | 2 | x | x |
| 26 | SiC | plasma OVD | 10 | 2 | 30 | o | Δ |
| 27 | aluminum alloy | — | 2 | 15 | — | x | x |
| 28 | SiC |  | — | — | — | ⊚ | x |

Result of evaluation
⊚: No corrosion
o Rate of area with corrosion is less than 1%.
Δ: Rate of area with corrosion is less than 5%.
x: Rate of area with corrosion is 5% or more.
*a: Content of silicon in an aluminum oxide.
**b: Size of dispersing silicon-containing matter.

TABLE 3

| Sample No. | Kind of substrate | Film formation method | Structure of coating film (observed by X-ray diffraction | Thickness of coating film (μm) | Corrosion resistance | |
|---|---|---|---|---|---|---|
|  |  |  |  |  | Gas corrosion test | Plasma irradiation test |
| 29 | stainless |  |  | 0.5 | ⊚ | ⊚ |
| 30 | steel |  |  | 10 | ⊚ | ⊚ |
| 31 | aluminum alloy |  |  | 5 | ⊚ | ⊚ |
| 32 |  | sputtering |  | 20 | ⊚ | ⊚ |
| 33 | titanium alloy |  | amorphous | 10 | ⊚ | ⊚ |
| 34 | low alloy steel |  |  | 0.1 | ⊚ | o |
| 35 | SiC |  |  | 20 | ⊚ | ⊚ |
| 36 |  | ion plating |  | 1 | ⊚ | o |

TABLE 3-continued

| Sample No. | Kind of substrate | Film formation method | Structure of coating film (observed by X-ray diffraction) | Thickness of coating film (μm) | Corrosion resistance Gas corrosion test | Plasma irradiation test |
|---|---|---|---|---|---|---|
| 37 | stainless steel | sputtering | | 0.05 | ○ | Δ |
| 38 | aluminum alloy | | | 10 | ○ | Δ |
| 39 | | ion plating | crystalline portion is mixed | 10 | Δ | x |
| 40 | titanium alloy | | | 5 | x | x |
| 41 | SiC | plasma CVD | | 30 | ⊙ | Δ |
| 42 | aluminum alloy | — | — | — | x | x |
| 43 | SiC | | | — | ⊙ | x |

Result of evaluation
⊙: No corrosion
○Rate of area with corrosion is less than 1%.
Δ: Rate of area with corrosion is less than 5%.
x: Rate of area with corrosion is 5% or more.

TABLE 4

| Sample No. | Kind of substrate | Film formation method | O/Al ratio (measured by XPS) | Structure of coating film (observed by SX-ray diffraction) | Thickness of coating film (μm) | Corrosion resistance Gas corrosion test | Plasma irradiation test |
|---|---|---|---|---|---|---|---|
| 44 | stainless steel | | 1.49 | amorphous | 5 | ⊙ | ⊙ |
| 45 | | | 1.42 | | 20 | ⊙ | ⊙ |
| 46 | aluminum alloy | sputtering | 1.30 | | 0.1 | ⊙ | ○ |
| 47 | SiC | | 1.48 | | 10 | ⊙ | ⊙ |
| 48 | titanium alloy | | 1.45 | | 0.5 | ⊙ | ⊙ |
| 49 | low alloy steel | | 1.35 | | 5 | ○ | ○ |
| 50 | SiC | ion plating | 1.46 | | 20 | ⊙ | ⊙ |
| 51 | aluminum alloy | | 1.40 | | 10 | ○ | ⊙ |
| 52 | aluminum alloy | sputtering | 1.46 | | 0.05 | x | x |
| 53 | titanium alloy | | 1.53 | | 20 | Δ | Δ |
| 54 | | | 1.26 | | 5 | x | x |
| 55 | SiC | ion plating | 1.42 | crystalline portion is mixed | 10 | Δ | x |
| 56 | stainless steel | plasma CVD | 1.55 | | 30 | Δ | x |
| 57 | aluminum alloy | — | — | — | — | x | x |
| 58 | SiC | | | | — | x | x |

Result of evaluation
⊙: No corrosion
○Rate of area with corrosion is less than 1%.
Δ: Rate of area with corrosion is less than 5%.
x: Rate of area with corrosion is 5% or more.

TABLE 5

| Sample No. | Kind of substrate | Film formation method | Content of argon (atm %) | Number of * projections and/or recesses | Thickness of coating film (μm) | Corrosion resistance Gas corrosion test | Plasma irradiation test |
|---|---|---|---|---|---|---|---|
| 59 | aluminum alloy | | 2 | 5 | 5 | ⊙ | ⊙ |
| 60 | | | 0.5 | 20 | 0.1 | ⊙ | ⊙ |
| 61 | SiC | sputtering | 0.1 | 75 | 7 | ⊙ | ⊙ |
| 62 | | | 1.5 | 30 | 20 | ⊙ | ⊙ |
| 63 | titanium alloy | | 3 | 80 | 15 | ⊙ | ○ |
| 64 | low alloy steel | ion plating | 5 | 45 | 0.2 | ⊙ | ○ |
| 65 | SiC | | 6 | 120 | 0.5 | ○ | Δ |

TABLE 5-continued

| Sample No. | Kind of substrate | Film formation method | Content of argon (atm %) | Number of * projections and/or recesses | Thickness of coating film (μm) | Corrosion resistance Gas corrosion test | Corrosion resistance Plasma irradiation test |
|---|---|---|---|---|---|---|---|
| 66 | — | — | — | — | — | ⊙ | x |
| 67 | stainless steel | sputtering | 0.0005 | 100 | 10 | Δ | Δ |
| 68 | aluminum alloy | — | — | — | — | x | x |

Result of evaluation
⊙: No corrosion
o Rate of area with corrosion is less than 1%.
Δ: Rate of area with corrosion is less than 5%.
x: Rate of area with corrosion is 5% or more.
*: The number of projections and/or recesses produced in etching by a phosphoric acid. (observed by an SEM of 2000 magnifications with a view of 30 × 50 (μm).

TABLE 6

| Sample No. | Kind of substrate | Film formation method | Content of argon (atm %) | Number of * projections and/or recesses | Thickness of coating film (μm) | Corrosion resistance Gas corrosion test | Corrosion resistance Plasma irradiation test |
|---|---|---|---|---|---|---|---|
| 69 | aluminum | — | — | 5 | — | ⊙ | o |
| 70 | oxide | — | — | 40 | — | ⊙ | ⊙ |
| 71 | aluminum alloy | | 0.2 | 30 | 10 | ⊙ | ⊙ |
| 72 | | | 3 | 80 | 15 | ⊙ | ⊙ |
| 73 | titanium alloy | sputtering | 0.9 | 5 | 5 | ⊙ | ⊙ |
| 74 | stainless steel | | 0.08 | 40 | 0.5 | ⊙ | o |
| 75 | SiC | | 1.8 | 65 | 20 | ⊙ | ⊙ |
| 76 | | ion plating | 2 | 78 | 1 | ⊙ | o |
| 77 | stainless steel | sputtering | 6 | 100 | 0.1 | o | Δ |
| 78 | aluminum alloy | | 10 | 160 | 5 | o | Δ |
| 79 | SiC | plasma CVD | 0.01 | 30 | 35 | ⊙ | Δ |
| 80 | aluminum alloy | — | — | — | — | x | x |
| 81 | SiC | — | — | — | — | ⊙ | x |

Result of evaluation
⊙: No corrosion
o Rate of area with corrosion is less than 1%.
Δ: Rate of area with corrosion is less than 5%.
x: Rate of area with corrosion is 5% or more.
*: The number of projections and/or recesses produced in etching by a phosphoric acid. (observed by an SEM of 2000 magnifications with a view of 30 × 50 (μm).

TABLE 7

| Sample No. | Kind of implanted ion | Amount of ion implantation (ion/cm$^2$) | Peeling of film | Cracks | Damage of quartz glass |
|---|---|---|---|---|---|
| 82 | no ion implantation | — | x | x | o |
| 83 | Al | 5 × 10$^{14}$ | ⊙ | o | ⊙ |
| 84 | Al | 1 × 10$^{15}$ | ⊙ | o | ⊙ |
| 85 | Al | 1 × 10$^{16}$ | ⊙ | ⊙ | ⊙ |
| 86 | Al | 1 × 10$^{17}$ | ⊙ | ⊙ | ⊙ |
| 87 | Si | 5 × 10$^{14}$ | ⊙ | o | ⊙ |
| 88 | Si | 1 × 10$^{15}$ | ⊙ | o | ⊙ |
| 89 | Si | 1 × 10$^{16}$ | ⊙ | ⊙ | ⊙ |
| 90 | Si | 1 × 10$^{17}$ | ⊙ | ⊙ | ⊙ |
| 91 | O | 5 × 10$^{14}$ | ⊙ | o | ⊙ |
| 92 | O | 1 × 10$^{15}$ | ⊙ | ⊙ | ⊙ |
| 93 | O | 1 × 10$^{16}$ | ⊙ | ⊙ | ⊙ |
| 94 | O | 1 × 10$^{17}$ | ⊙ | ⊙ | ⊙ |
| 95 | N | 5 × 10$^{14}$ | ⊙ | o | ⊙ |
| 96 | N | 1 × 10$^{15}$ | ⊙ | o | ⊙ |
| 97 | N | 1 × 10$^{16}$ | ⊙ | ⊙ | ⊙ |
| 98 | N | 1 × 10$^{17}$ | ⊙ | ⊙ | ⊙ |

⊙: No cracks, peeling, and damage
o: A small amount of cracks, peeling, and damage
x: A large amount of cracks, peeling, and damage

TABLE 8

| Sample No. | Thickness of Al$_2$O$_3$ coating film (μm) | Peeling of film | Cracks | Damage of quartz glass |
|---|---|---|---|---|
| 99 | 0.05 | x | — | x |
| 100 | 0.1 | ⊙ | o | ⊙ |
| 101 | 1 | ⊙ | ⊙ | ⊙ |
| 102 | 5 | ⊙ | ⊙ | ⊙ |
| 103 | 10 | ⊙ | ⊙ | ⊙ |
| 104 | 15 | ⊙ | ⊙ | ⊙ |

TABLE 8-continued

| Sample No. | Thickness of Al₂O₃ coating film (μm) | Peeling of film | Cracks | Damage of quartz glass |
|---|---|---|---|---|
| 105 | 20 | ⊚ | o | ⊚ |
| 106 | 22 | o | x | o |
| 107 | 25 | x | x | x |
| 108 | 30 | x | x | x |

⊚: No cracks, peeling, and damage
o: A small amount of cracks, peeling, and damage
x: A large amount of cracks, peeling, and damage
—: Measurement was impossible

TABLE 9

| Sample No. | Thickness of ZrO₂ film (%) | Peeling of film | Cracks | Damage of quartz glass |
|---|---|---|---|---|
| 109 | 0 | x | x | o |
| 110 | 0.05 | o | x | ⊚ |
| 111 | 0.1 | ⊚ | o | ⊚ |
| 112 | 1 | ⊚ | ⊚ | ⊚ |
| 113 | 10 | ⊚ | ⊚ | ⊚ |
| 114 | 30 | ⊚ | ⊚ | ⊚ |
| 115 | 50 | ⊚ | o | ⊚ |
| 116 | 55 | o | x | ⊚ |
| 117 | 60 | x | x | o |
| 118 | 70 | x | x | o |

⊚: No cracks, peeling, and damage
o: A small amount of cracks, peeling, and damage
x: A large amount of cracks, peeling, and damage

TABLE 10

| Sample No. | Total thickness of base & coating film (μm) | Peeling of film | Cracks | Damage of quartz glass |
|---|---|---|---|---|
| 119 | 0.05 | x | — | x |
| 120 | 0.1 | ⊚ | o | ⊚ |
| 121 | 1 | ⊚ | ⊚ | ⊚ |
| 122 | 5 | ⊚ | ⊚ | ⊚ |
| 123 | 10 | ⊚ | ⊚ | ⊚ |
| 124 | 15 | ⊚ | ⊚ | ⊚ |
| 125 | 20 | ⊚ | o | ⊚ |
| 126 | 22 | o | x | o |
| 127 | 25 | x | x | x |
| 128 | 30 | x | x | x |

⊚: No cracks, peeling, and damage
○: A small amount of cracks, peeling, and damage
x: A large amount of cracks, peeling, and damage
—: Measurement was impossible

TABLE 11

| Sample No | Thickness of SiO₂ film (%) | Peeling of film | Cracks |
|---|---|---|---|
| 129 | 0 | x | x |
| 130 | 0.05 | o | x |
| 131 | 0.1 | ⊚ | o |
| 132 | 1 | ⊚ | ⊚ |
| 133 | 10 | ⊚ | ⊚ |
| 134 | 30 | ⊚ | ⊚ |
| 135 | 50 | ⊚ | o |
| 136 | 55 | o | x |
| 137 | 60 | x | x |
| 138 | 70 | x | x |

⊚: No cracks, peeling, and damage
o: A small amount of cracks, peeling, and damage
x: A large amount of cracks, peeling, and damage

TABLE 12

| Sample No. | Total thickness of base and coating films (μm) | Peeling of film | Cracks | Damage of quartz glass |
|---|---|---|---|---|
| 139 | 0.05 | x | x | x |
| 140 | 0.1 | ⊚ | o | ⊚ |
| 141 | 1 | ⊚ | ⊚ | ⊚ |
| 142 | 5 | ⊚ | ⊚ | ⊚ |
| 143 | 10 | ⊚ | ⊚ | ⊚ |
| 144 | 15 | ⊚ | ⊚ | ⊚ |
| 145 | 20 | ⊚ | o | ⊚ |
| 146 | 22 | o | x | o |
| 147 | 25 | x | x | x |
| 148 | 30 | x | x | x |

⊚: No cracks, peeling, and damage
o: A small amount of cracking, peeling, and damage
x: A large amount of cracking, peeling, and damage

TABLE 13

| Sample No | Film formation method | Presence or absence of cracks |
|---|---|---|
| 149 | RF magnetron sputtering (5 μm) | with cracks |
| 150 | RF conventional sputtering (5 μm) | without cracks |

TABLE 14

| Sample No. | Film formation method | Plasma resistance | Cracking resistance |
|---|---|---|---|
| 149 | RF magnetron sputtering (10 μm) | o | Δ |
| 150 | RF conventional sputtering (10 μm) | Δ | o |
| 151 | RF conventional sputtering (1 μm) + RF magnetron sputtering (9 μm) | o | o |
| 152 | RF conventional puttering (1 μm) + ion assisit deposition (9 μm) | o | o |

Result of evaluation

| Plasma resistance | Cracking resistance |
|---|---|
| o: Rate of area with corrosion is less than 1%. | No cracking. |
| Δ: Rate of area with corrosion is less than 5%. | A small amount of cracks. |
| x: Rate of area with corrosion is 5% or more. | A large amount of cracks. |

TABLE 15

| Sample No. | Film formation method | Coating film stress (MPa) |
|---|---|---|
| 153 | high frequency magnetron sputtering | $-1.05 \times 10^2$ |
| 154 | high frequency conventional sputtering | $-2.00 \times 10^3$ |
| 155 | ion beam deposition | $-3.90 \times 10^4$ |

Remarks: Mark + indicates tensile stress, and mark − indicates compressive stress.

TABLE 16

| Sample No. | Film formation method | Plasma irradiation test | Thermal cycle test |
|---|---|---|---|
| 156 | high frequency magnetron sputtering | o | Δ |
| 157 | high frequency conventional sputtering | Δ | o |
| 158 | ion beam deposition | x | x |

TABLE 16-continued

Result of evaluation

| Plasma resistance | Cracking resistance |
|---|---|
| ○: Rate of area with corrosion is less than 1%. | No cracking. |
| Δ: Rate of area with corrosion is less than 5%. | A small amount of cracks. |
| x: Rate of area with corrosion is 5% or more. | A large amount of cracks. |

TABLE 17

| Sample No. | Discharge gas | Rate of area with pin holes (%) | Plasma irradiation test |
|---|---|---|---|
| 159 | Ar only | 0 | ○ |
| 160 | Ar + 2% $O_2$ | 0.03 | ○ |
| 161 | Ar + 4% $O_2$ | 0.73 | Δ |
| 162 | Ar + 6% $O_2$ | 1.48 | x |
| 163 | Ar + 8% $O_2$ | 6.31 | x |
| 164 | Ar + 12% $O_2$ | 15.6 | x |
| 165 | Ar + 16% $O_2$ | 19.4 | x |
| 168 | Ar + 20% $O_2$ | 20.6 | x |

Result of evaluation

Plasma irradiation test

○: Rate of area with corrosion is less than 1%.
Δ: Rate of area with corrosion is less than 5%.
x: Rate of area with corrosion is 5% or more.

TABLE 18

| Condition of film formation | Area rate of inclusions (%) |
|---|---|
| with ring-shaped holder | 0.03 |
| without ring-shaped holder (Comparative example) | 6.72 |

What is claimed is:

1. A film comprising aluminum oxide and a silicon-containing material as an impurity, wherein the content of the silicon-containing material is 5 wt % or less when reduced to silicon, and wherein said film has no peak of a half-value width of 5° or less in X-ray diffraction.

2. A film according to claim 1, wherein the silicon-containing material has a size of 0.5 μm or less.

3. The film claim 1 having an oxygen-to-aluminum atomic ratio of 1.3 or more to below 1.5.

4. A film according to claim 1 wherein a hundred projection and/or recesses or less are observed in average over a surface having been etched for 1 minute at 80° C. using a phosphoric acid having a purity of 85 percent or more at a view of 30×50 (μm) with use of a scanning electron microscope of 2000 magnifications.

5. A film according to claim 1 having such a characteristic that after being etched for 1 minute at 80° C. using a phosphoric acid having a purity of 85 percent or more, the film has 5 percent or less of non-etched portion of the surface of the coating film which is observed at a view of 30×50 (μm) with use of a scanning electron microscope of 2000 magnifications.

6. A laminated product comprising a substrate and a film of claim 1.

7. A laminated product according to claim 6, wherein the thickness of the film is in a range between 0.1 and 20 μm.

8. A window material for use in a vacuum apparatus containing a corrosive gas in a chamber of the apparatus and having a high transparency and a heat resistance, the window material comprising a transparent ceramic having a surface facing an inside of the chamber, the surface being formed with a layer containing an enriched concentration of one or more elements selected from the group consisting of aluminum, silicon, oxide, and nitrogen by ion implantation, and a film of claim 1 as a top layer.

9. A window material for use in a vacuum apparatus according to claim 8, wherein the thickness of the film is in a range between 0.1 and 20 μm.

10. A window material for use in a vacuum apparatus containing a corrosive gas in a chamber of the apparatus and having a high transparency and a heat resistance, the window material comprising a transparent ceramic having a surface facing an inside of the chamber, the surface being formed with a base layer including a material having a thermal expansion coefficient substantially equal to or larger than the transparent ceramic and smaller than a film of claim 1 and a film of claim 1 as an upper layer.

11. A window material for use in a vacuum apparatus according to claim 10, wherein the base layer includes one or more materials selected from the group consisting of $SiO_2$, $ZrO_2$, $HfO_2$, $SnO_2$, $TiO_2$, and borosilicate glass.

12. A window material for use in a vacuum apparatus according to claim 11, wherein the base layer and the film are formed by sputtering.

13. A window material for use in a vacuum apparatus according to claim 12, wherein the thickness of the base layer is in a range between 0.1 and 50 percent of a total thickness of the base layer and the film.

14. A window material for use in a vacuum apparatus according to claim 10, wherein the base layer is a crystalline coating layer mainly made of crystalline $Al_2O_3$.

15. A window material for use in a vacuum apparatus according to claim 14, wherein the base layer is formed by sputtering using no magnet in a target portion, and the film is formed by magnetron sputtering or vacuum deposition.

16. A window material for use in a vacuum apparatus according to claim 15, wherein the thickness of the base layer is in a range between 0.01 and 5 μm.

17. A film comprising aluminum oxide and argon, wherein said argon is present in an amount of 5 atm % or less.

18. A window material for use in a vacuum apparatus according to claims 13 or 16, wherein the total thickness of the base layer and the film is in a range between 0.1 and 20 μm.

19. A method for producing a coating film capable of resistance to halogen-containing gas corrosion and halogen-containing plasma corrosion, the method comprising a step of executing a high-frequency magnetron sputtering in a charge gas containing argon and 5 atm % or less of $O_2$ gas with a target material made of $Al_2O_3$ to form a thin film including an aluminum oxide on the substrate.

20. A method for producing a laminated product, the method comprising a step of executing a sputtering in a charge gas containing an inert gas to form a thin film including aluminum oxide on a substrate including $SiO_2$, a surface of the substrate being shielded from inert gas plasma except the portion to be formed with the thin film.

21. A method according to claims 19 or 20, wherein the substrate is a window material made of a transparent ceramic for a vacuum apparatus containing a corrosive gas in a chamber of the apparatus, an inner surface of the material being with the thin film while side and outer surfaces of the material being shielded from inert gas plasma.

* * * * *